United States Patent
Kajimoto et al.

(10) Patent No.: US 7,402,495 B2
(45) Date of Patent: Jul. 22, 2008

(54) METHOD FOR MANUFACTURING A SEMICONDUCTOR DEVICE

(75) Inventors: Minori Kajimoto, Mie (JP); Mitsuhiro Noguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 11/412,951

(22) Filed: Apr. 28, 2006

(65) Prior Publication Data
US 2006/0244094 A1 Nov. 2, 2006

(30) Foreign Application Priority Data
Apr. 28, 2005 (JP) ............................. 2005-132163

(51) Int. Cl.
*H01L 21/336* (2006.01)
*H01L 21/8236* (2006.01)
*H01L 21/8238* (2006.01)

(52) U.S. Cl. ...................... 438/289; 438/276; 438/217; 438/199; 257/E21.689; 257/E21.337

(58) Field of Classification Search ................ 438/289, 438/618, 199, 217, 276, 419, 527; 257/508, 257/392, E21.689, E21.337
See application file for complete search history.

(56) References Cited

U.S. PATENT DOCUMENTS

| | | | |
|---|---|---|---|
| 6,306,709 B1 | 10/2001 | Miyagi et al. | |
| 6,677,194 B2 | 1/2004 | Yamanaka et al. | |
| 6,703,670 B1 * | 3/2004 | Lines | 257/392 |
| 6,803,285 B2 | 10/2004 | Mistry et al. | |
| 7,144,795 B1 * | 12/2006 | Lines | 438/527 |
| 7,161,216 B1 * | 1/2007 | Lines | 257/392 |
| 7,235,476 B2 * | 6/2007 | Nakagawa | 438/622 |
| 2005/0230781 A1 * | 10/2005 | Ema et al. | 257/510 |
| 2006/0091470 A1 | 5/2006 | Noguchi et al. | |

FOREIGN PATENT DOCUMENTS

JP 2000-323587 11/2000

OTHER PUBLICATIONS

U.S. Appl. No. 11/031,036, filed Jan. 10, 2005, Mitsuhiro Noguchi et al.
U.S. Appl. No. 11/412,951, filed Apr. 28, 2006, Kajimoto et al.
U.S. Appl. No. 11/671,229, filed Feb. 5, 2007, Kato et al.

* cited by examiner

*Primary Examiner*—Scott B. Geyer
*Assistant Examiner*—Mohsen Ahmadi
(74) *Attorney, Agent, or Firm*—Oblon, Spivak, McClelland, Maier & Neustadt, P.C.

(57) ABSTRACT

A method of manufacturing a semiconductor device includes forming a first semiconductor region of a first conductive type and a second semiconductor region of a second conductive type in a predetermined region of the semiconductor substrate of a first conductive type; and first to third ion implantation processes sequentially executed for controlling threshold voltages corresponding to each transistor formed on the semiconductor substrate the first semiconductor region, and the second semiconductor region respectively. The first ion implantation process is executed in a high-threshold low-voltage transistor forming region of the first semiconductor region after forming the first semiconductor region. The second ion implantation process is executed in a high-threshold low-voltage transistor forming region of the second semiconductor region. The third ion implantation is executed simultaneously in the low-threshold low-voltage transistor forming regions of the semiconductor substrate and the second semiconductor region respectively.

6 Claims, 29 Drawing Sheets

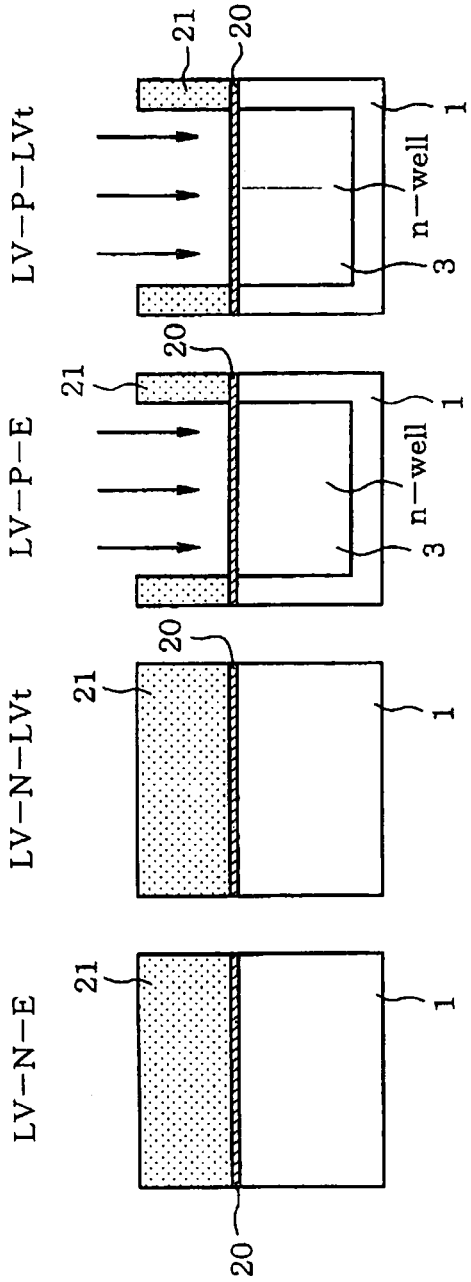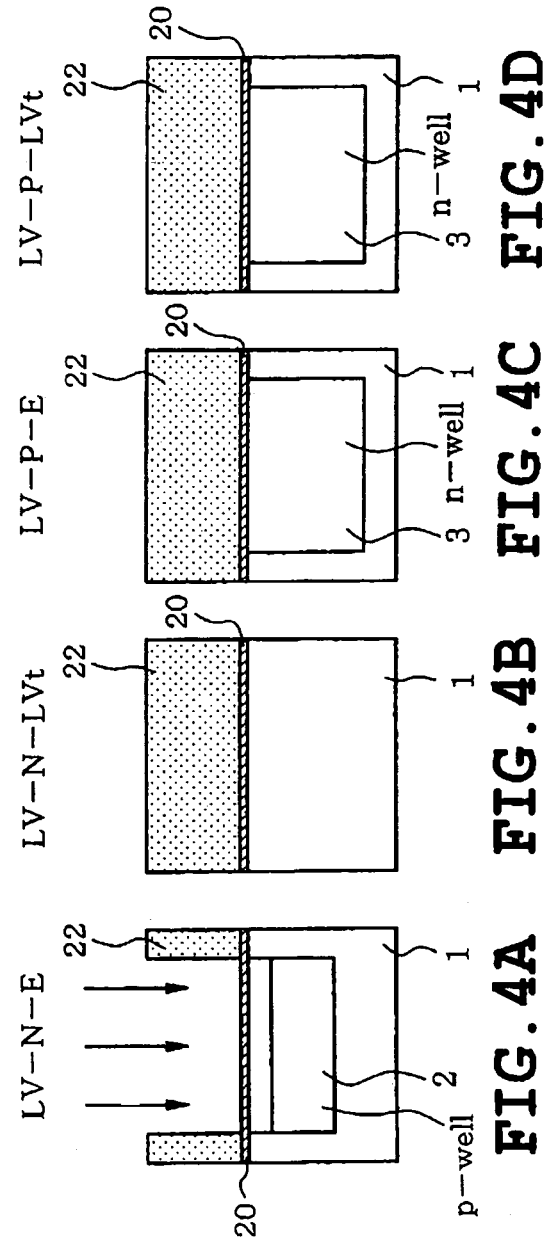

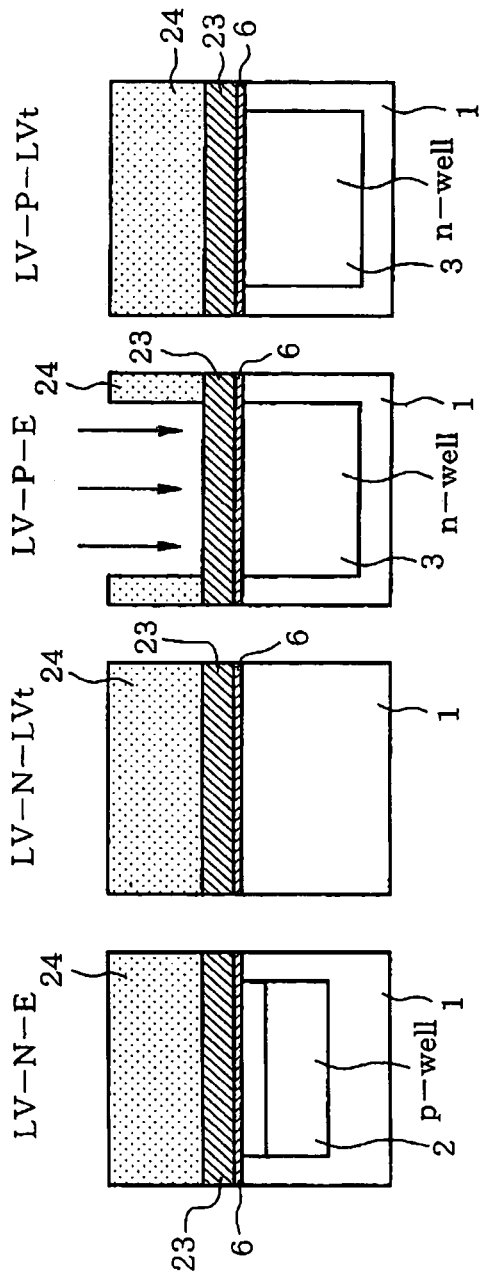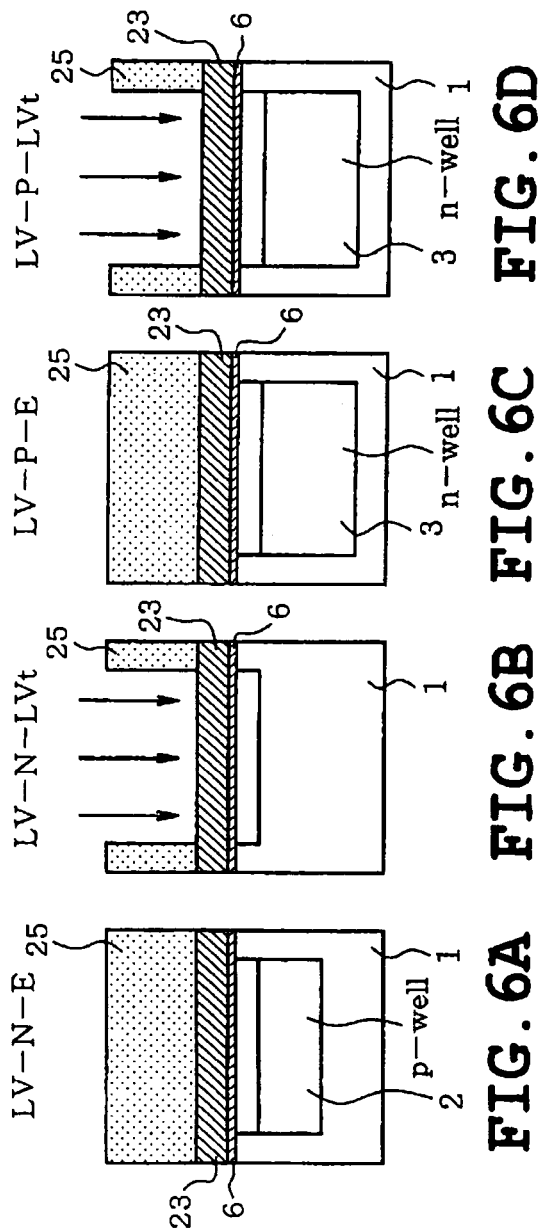

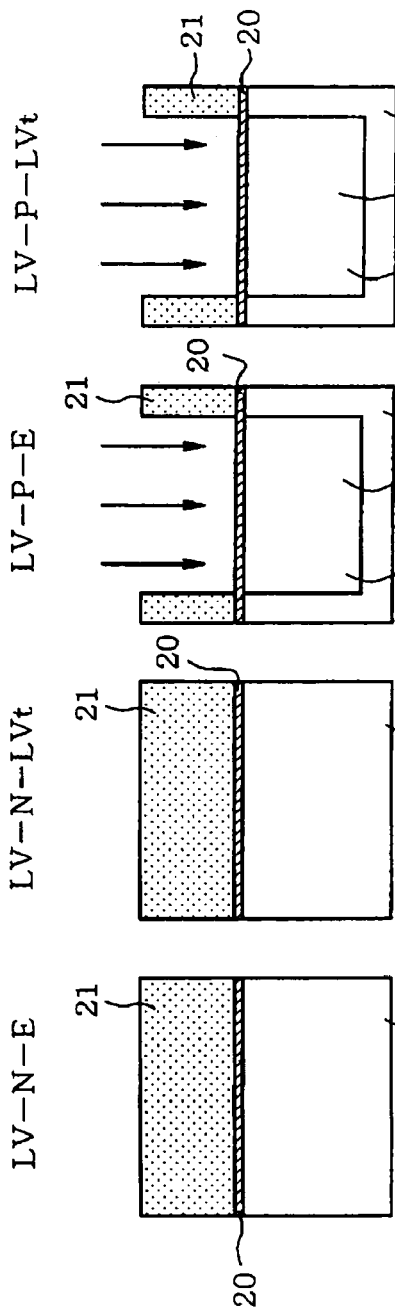
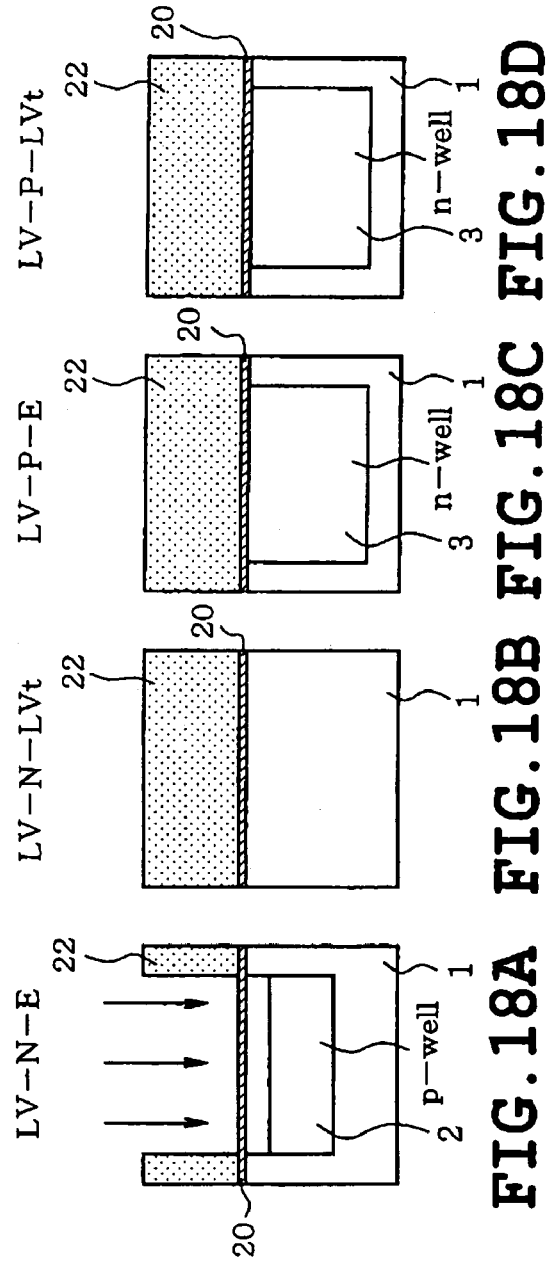

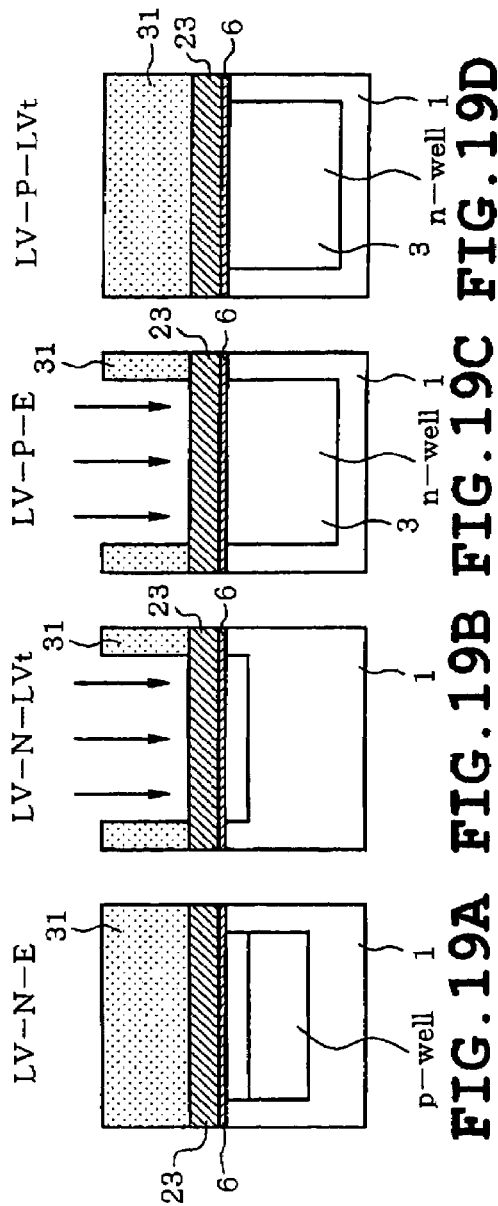
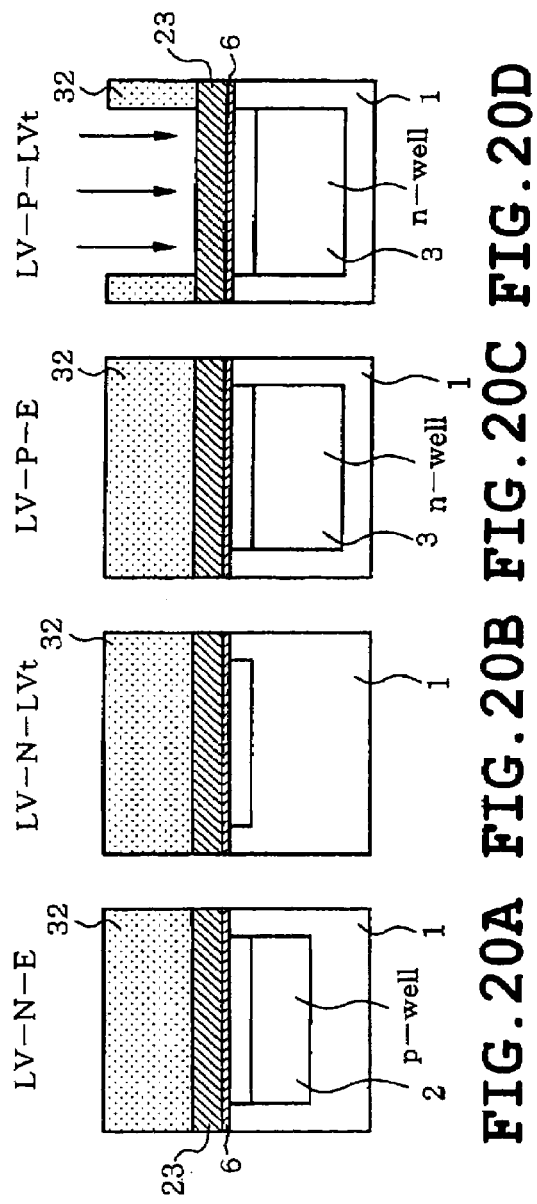

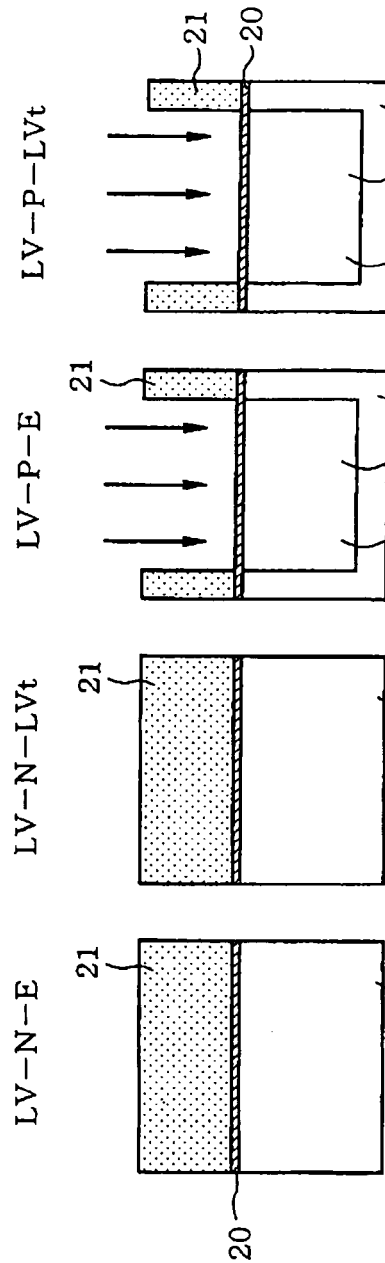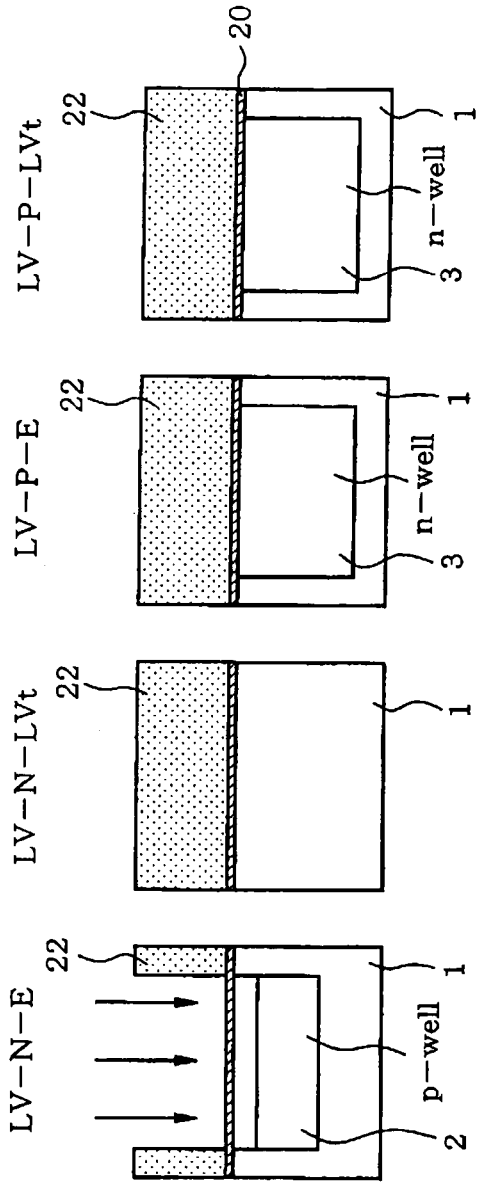

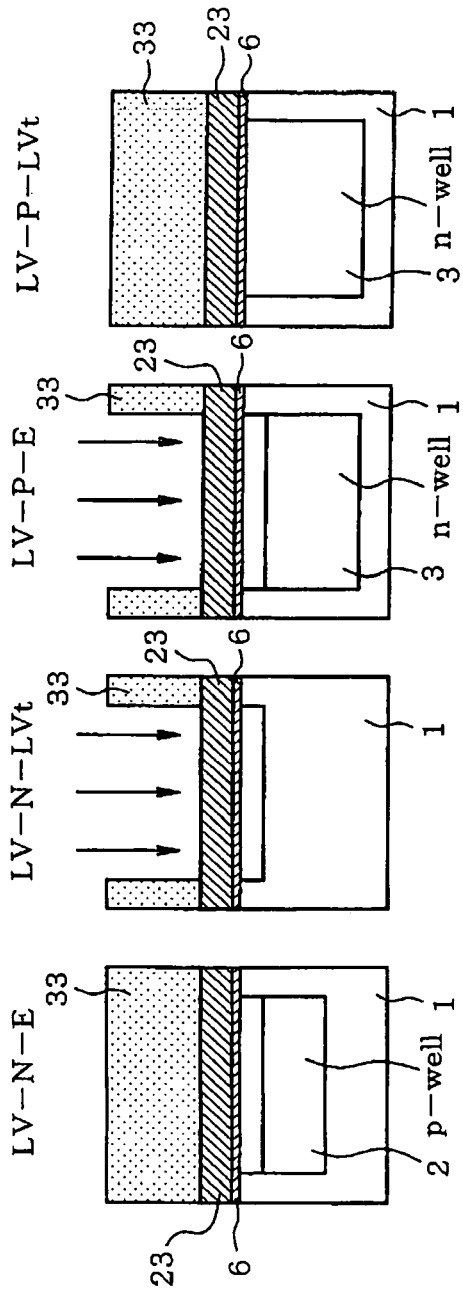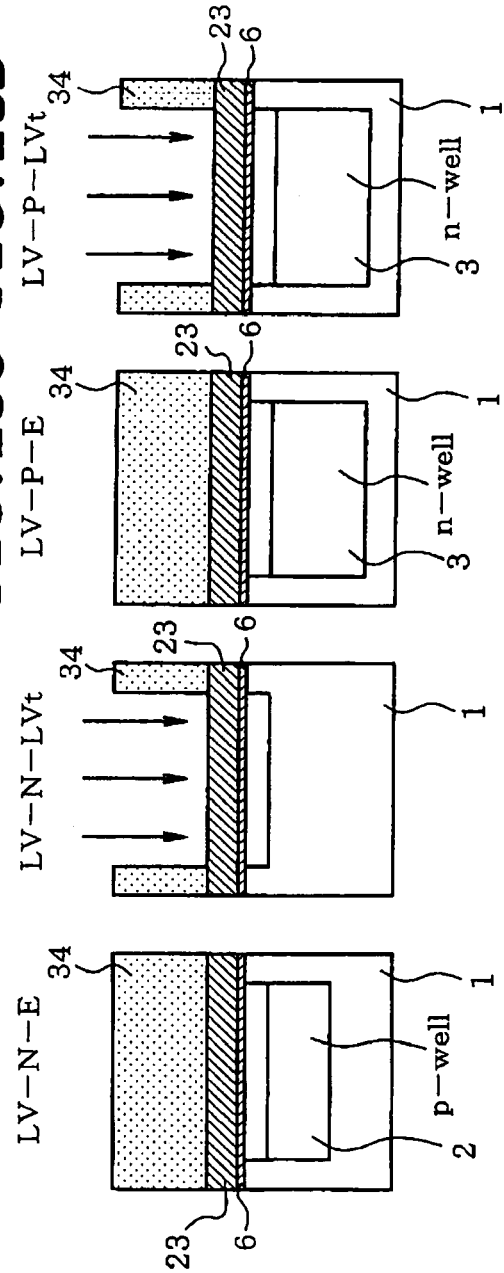

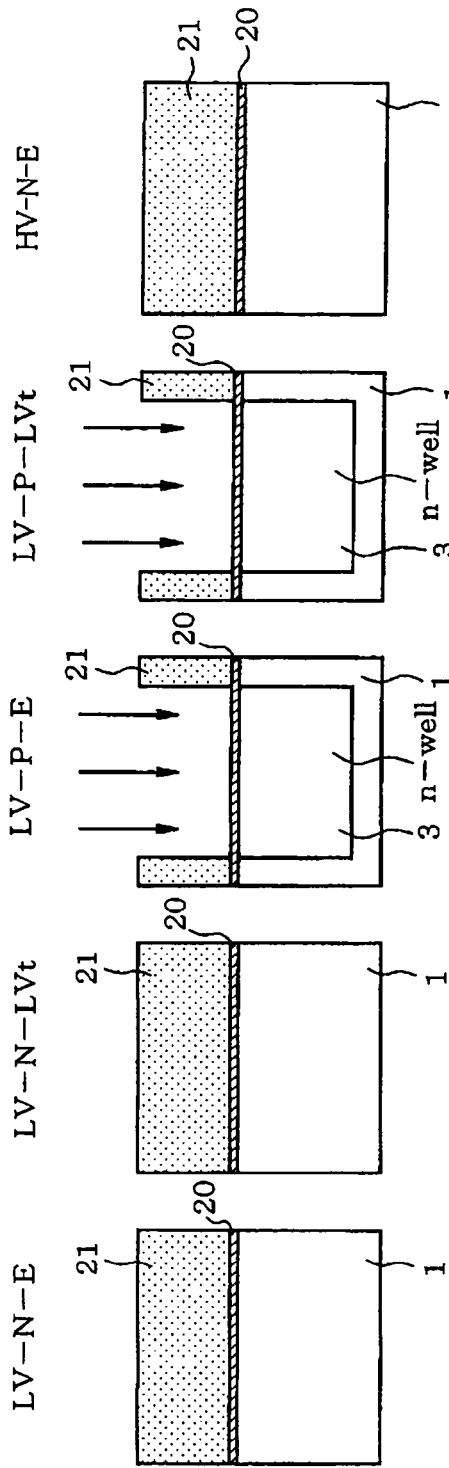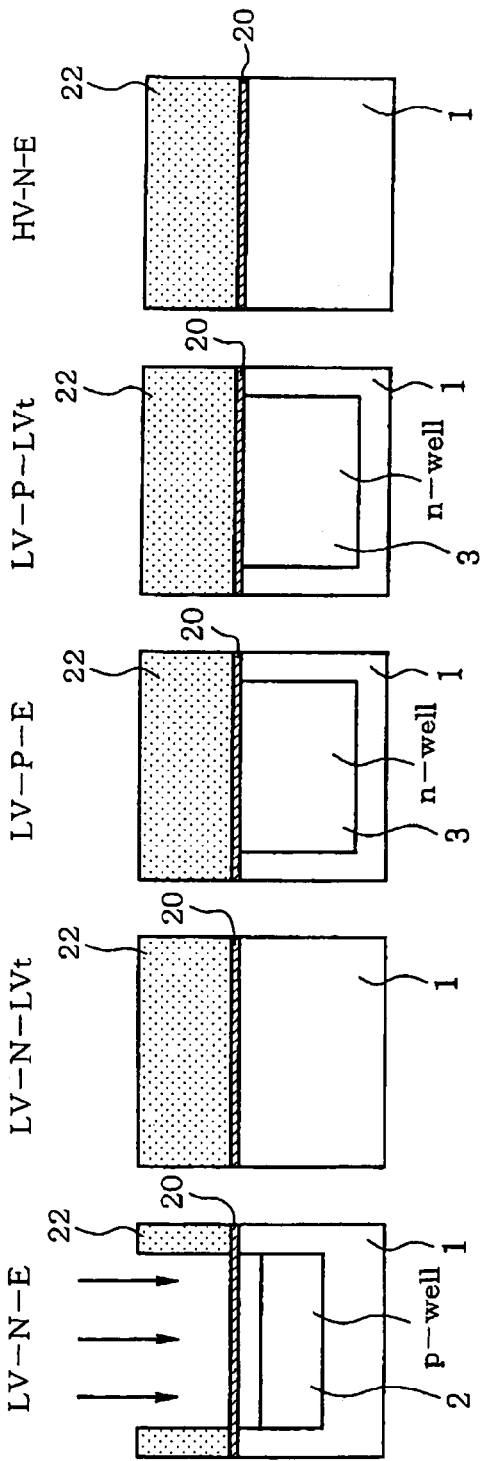

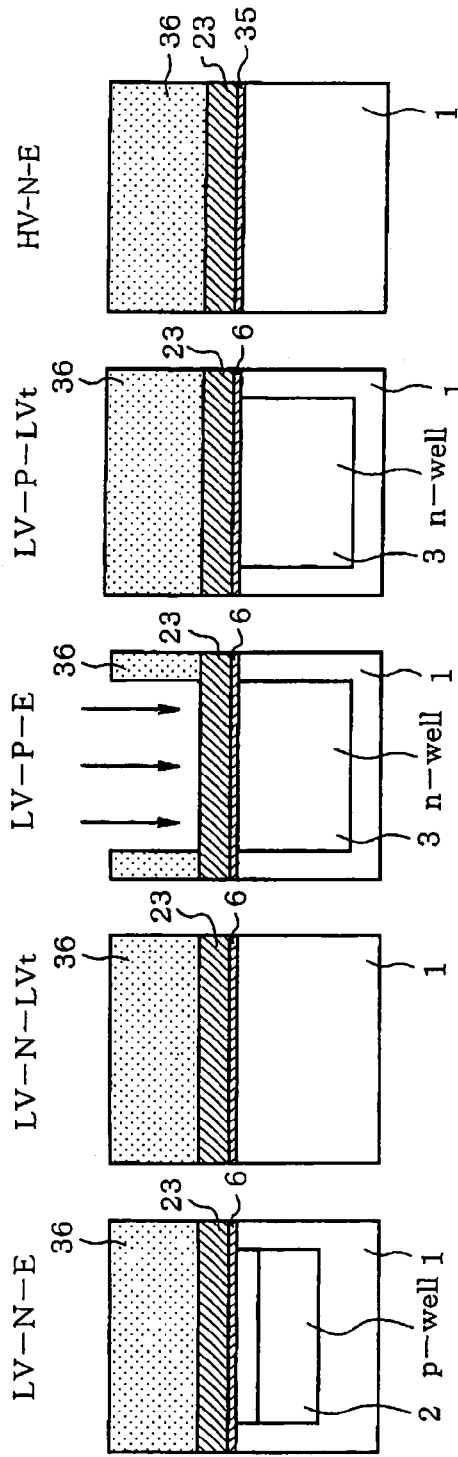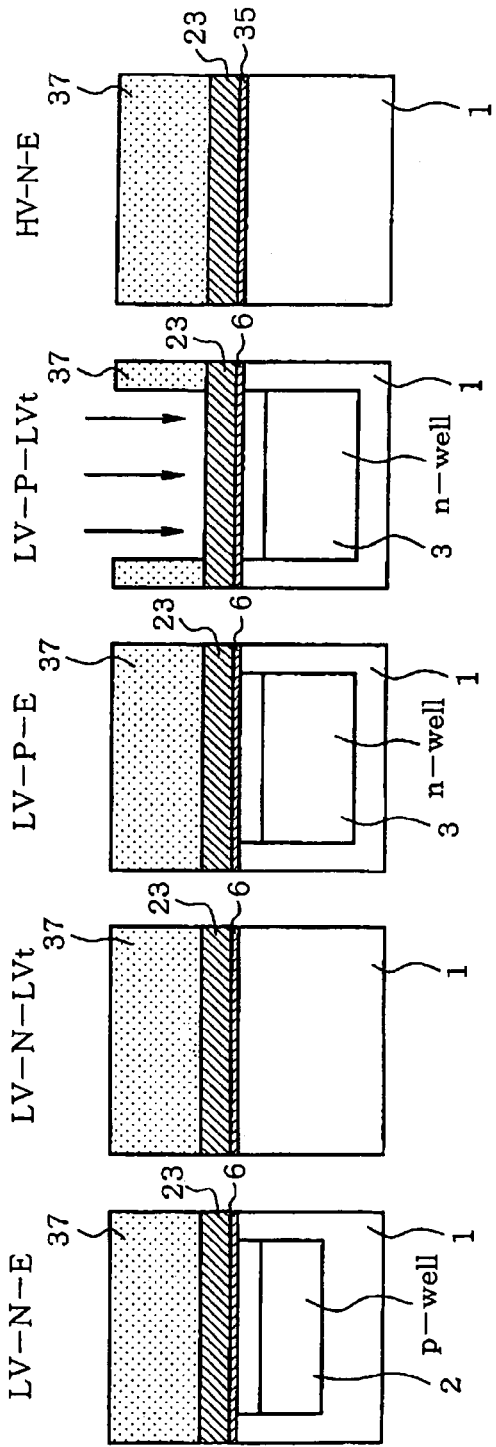

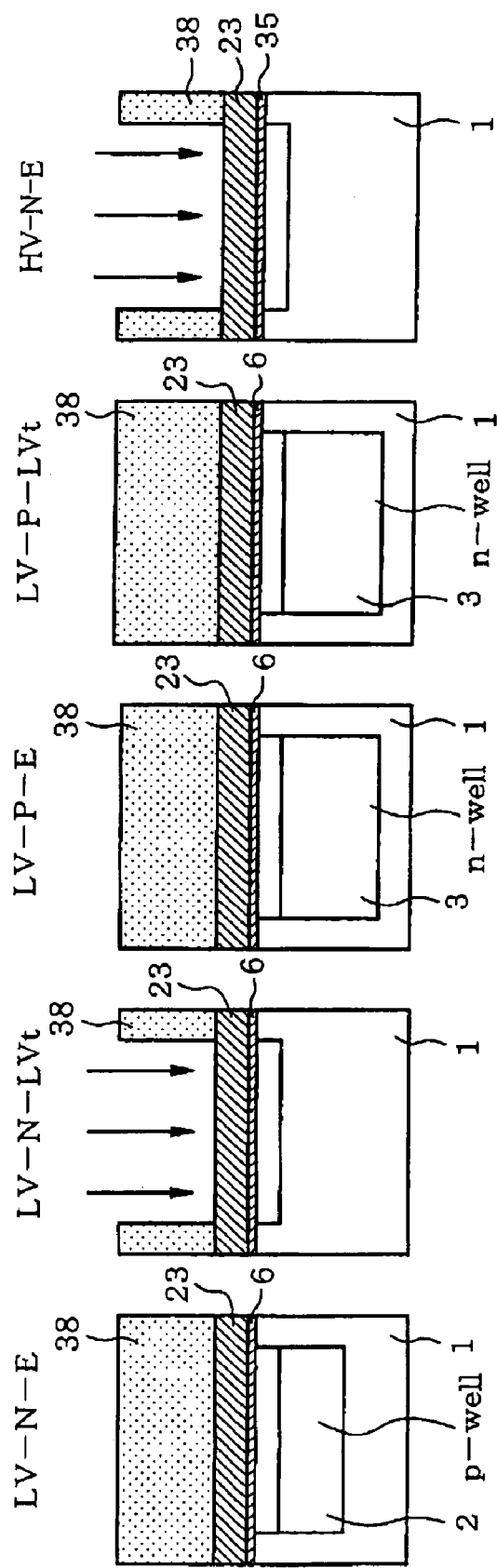

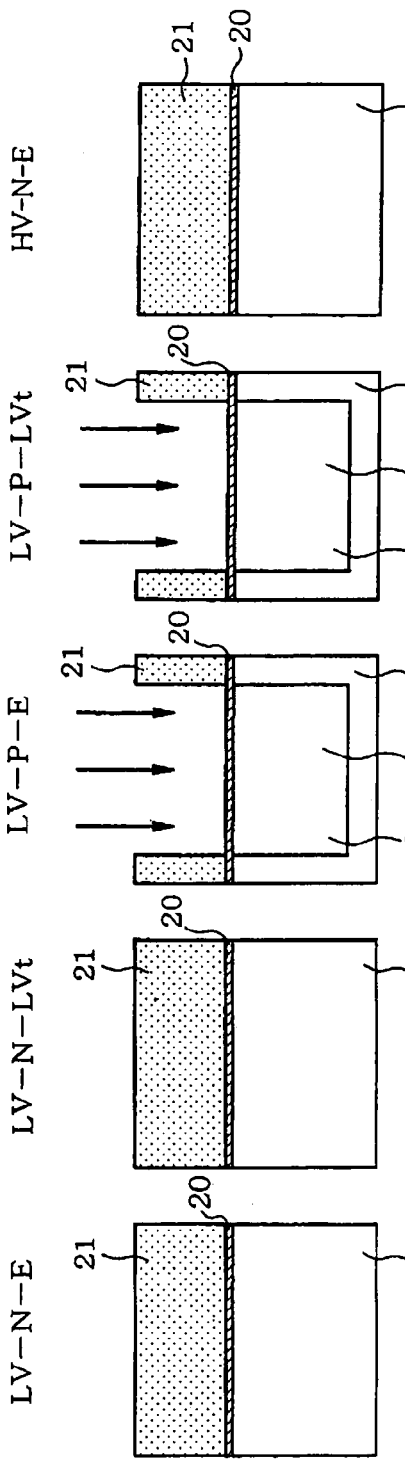

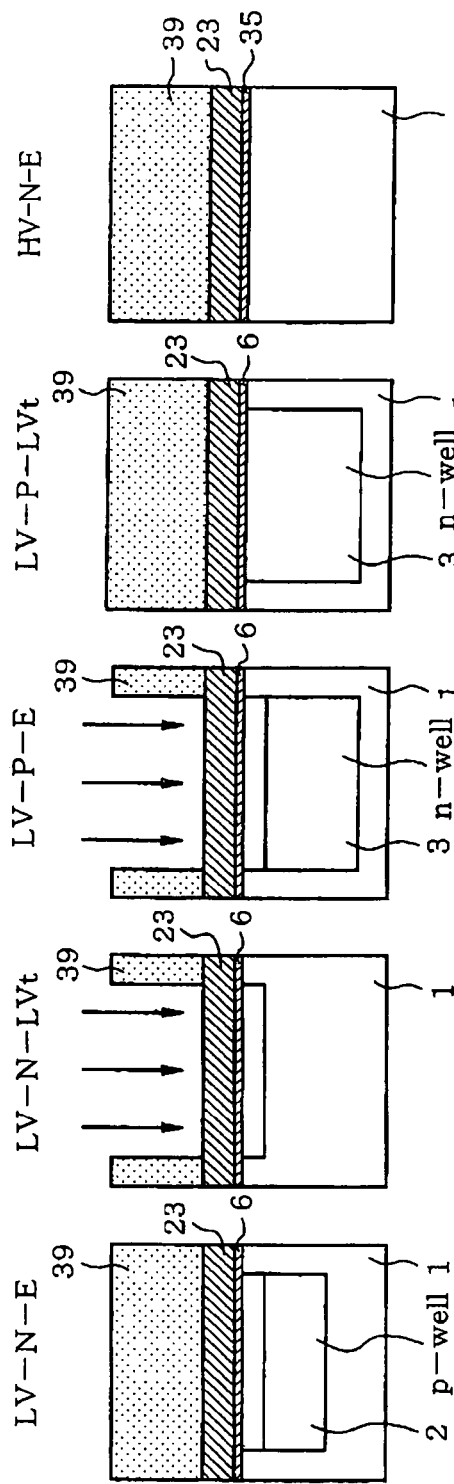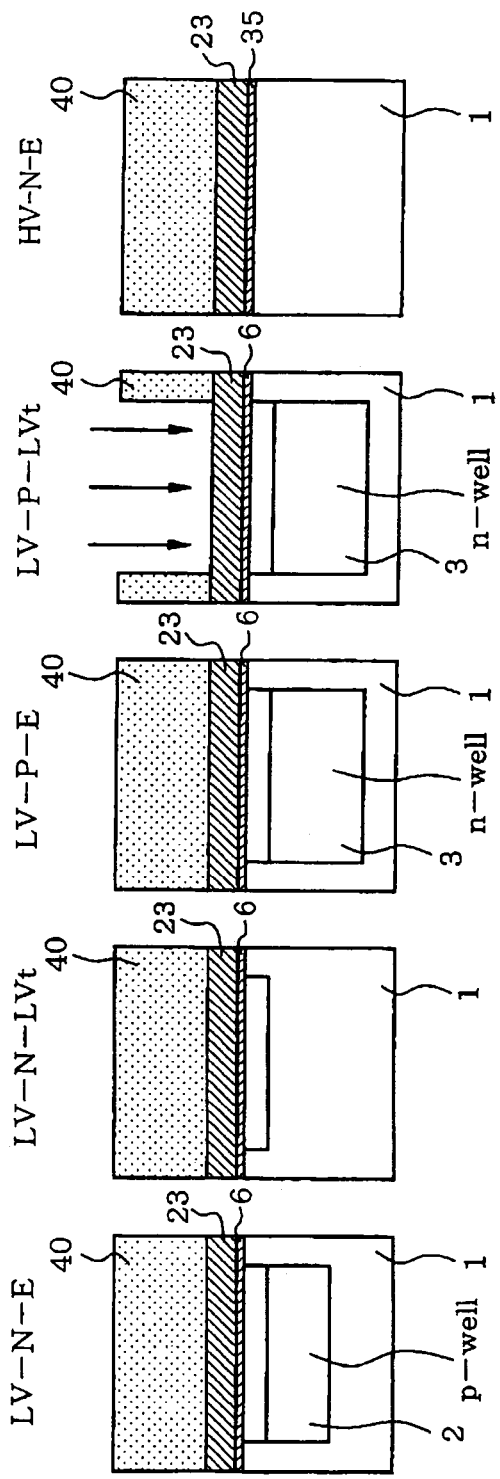

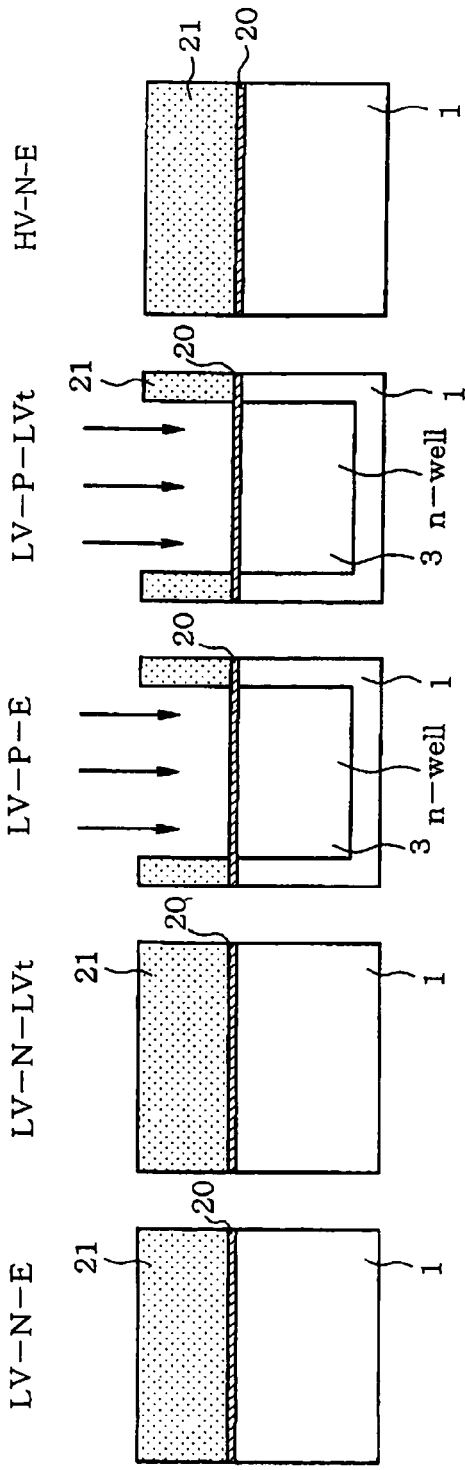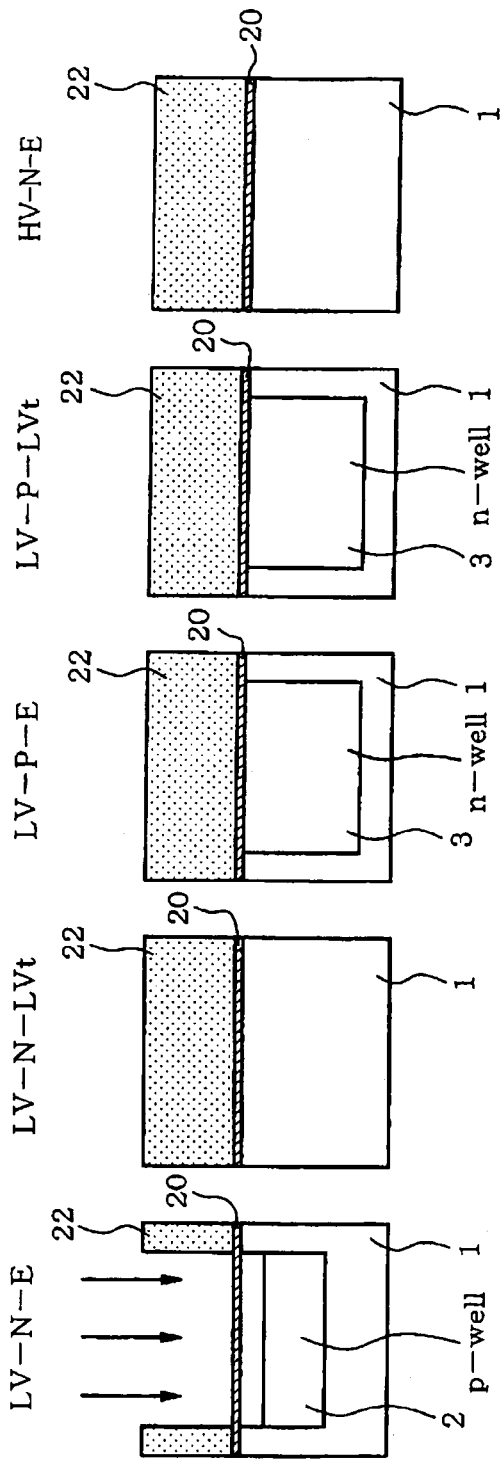

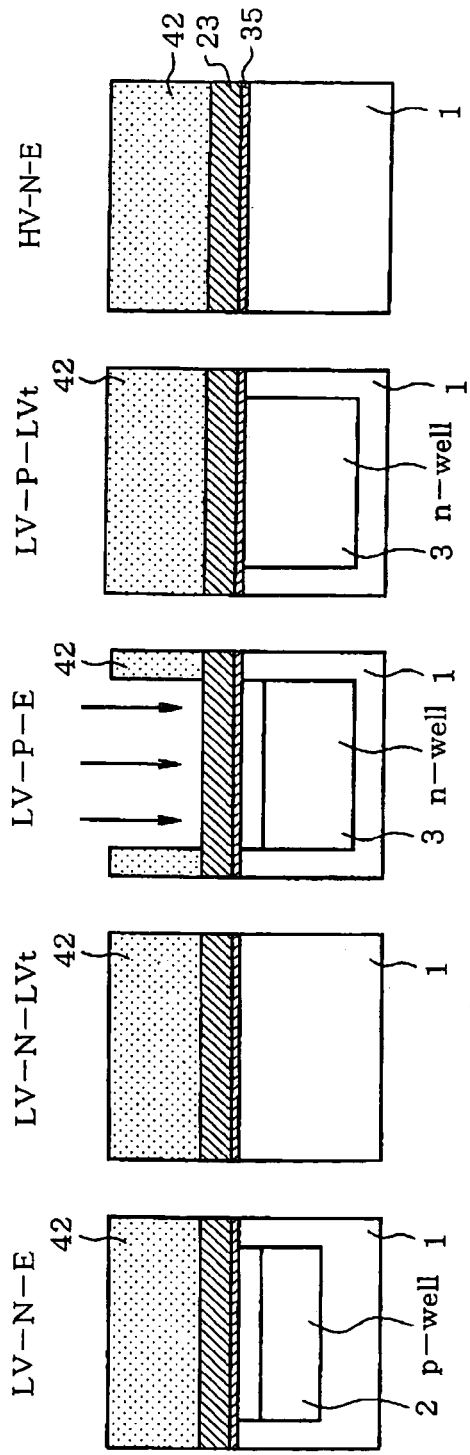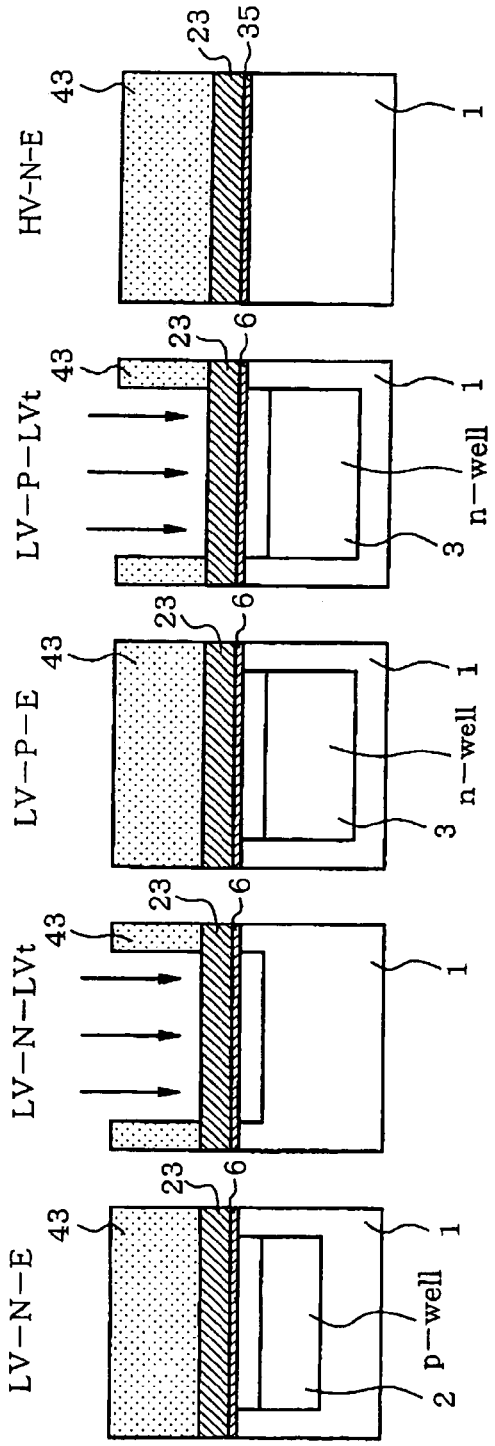

METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 2005-132163, filed on, Apr. 28, 2005 the entire contents of which are incorporated herein by reference.

BACKGROUND OF THE INVENTION

1. Field of Invention

The present invention relates to a method of manufacturing a semiconductor device, particularly to a semiconductor device including a memory cell region and peripheral circuit region, the peripheral circuit region having a transistor capable of operating under low power voltage.

2. Description of the Related Art

Among semiconductor devices, a typical nonvolatile memory such as a NAND flash memory includes a memory cell and a peripheral circuit cell. The memory cell is driven by the peripheral circuit cell and is provided with a low-voltage transistor. The peripheral circuit cell, on the other hand, is generally provided with both types of high- and low-voltage transistors of P-type and N-type respectively.

The latest application of such semiconductor device contains therein a low-voltage power source. Such configuration allows combination of two types of low-voltage transistors to be provided in a single device, namely a high-threshold type powered by external source and a low-threshold type powered by internal source. The process of forming the low-voltage transistor in such case involves implantation of ions into a well formed in the semiconductor substrate in order to control the threshold voltage. A complimentary metal oxide semiconductor integrated circuit (CMOSIC) having a combination of transistors of varying threshold voltages is disclosed in JP-A-2000-323587.

The aforementioned patent publication discloses a method of manufacturing a semiconductor device in which an N-well and a P-well is created whereafter MOS transistors having different threshold voltages are formed in each well by performing less number of times of ion implantation than the number of types of different threshold voltages.

However, when forming transistors having different threshold voltages by using wells of identical conductive type, a separate ion implantation process is required after forming the wells in order to form the transistors having different threshold voltages. Such requirement renders process cycle reduction difficult.

BRIEF SUMMARY OF THE INVENTION

Therefore, an object of the present invention is to provide a semiconductor device that does not require an execution of a separate ion implantation process for controlling each threshold voltage of low-voltage transistors formed with channels of the same conductive type and to provide a method for manufacturing such semiconductor device.

The semiconductor device of the present invention includes a semiconductor substrate of a first conductive type, a first semiconductor region of the first conductive type formed on the semiconductor substrate, and a second semiconductor region of a second conductive type formed on the semiconductor substrate. The semiconductor device further includes a low-threshold low-voltage transistor formed on the semiconductor substrate, a high-threshold low-voltage transistor formed on the first semiconductor substrate, the high-threshold low-voltage transistor and low-threshold low-voltage transistors formed on the second semiconductor substrate and an element isolation region formed on the semiconductor substrate to isolate the elements. The semiconductor device is characterized in that the transistor forming region of the low-threshold low-voltage transistor in the semiconductor substrate is surrounded by the first semiconductor region.

Also, the method of manufacturing the semiconductor device of the present invention involves forming the first semiconductor region of a first conductive type and a second semiconductor region of a second conductive type in a predetermined region of the semiconductor substrate of a first conductive type; and a first to third ion implantation process sequentially executed for controlling the threshold voltages corresponding to each transistor formed on the semiconductor substrate, the first semiconductor region and the second semiconductor region respectively. The first ion implantation process is executed in a high-threshold low-voltage transistor forming region of the first semiconductor region after the step forming the first semiconductor region. The second ion implantation process is executed in a high-threshold low-voltage transistor forming region of the second semiconductor region. The third ion implantation process is executed simultaneously in the low-threshold low-voltage transistor forming regions of the semiconductor substrate and the second semiconductor region respectively.

BRIEF DESCRIPTION OF THE DRAWINGS

Other objects, features and advantages of the present invention will become clear upon reviewing the following description of the embodiment with reference to the accompanying drawings, in which.

FIGS. 3A to 3D, 4A to 4D, 5A to 5D, 6A to 6D, are sectional views corresponding to each phase of the manufacturing process;

FIGS. 17A to 17C, 18A to 18C, 19A to 19C and 20A to 20D are sectional views of each portion corresponding to each phase of a manufacturing process according to a second embodiment of the present invention;

FIGS. 21A to 21D, 22A to 22D, 23A to 23D, 24A to 24D are sectional views of each portion corresponding to each phase of a manufacturing process according to a third embodiment of the present invention;

FIGS. 25A to 25E, 26A to 26E, 27A to 27E, 28A to 28E, and 29A to 29E are sectional views of each portion corresponding to each phase of a manufacturing process according to a fourth embodiment of the present invention;

FIGS. 30A to 30E, 31A to 31E, 32A to 32E, 33A to 33E, 34A to 34E are sectional views corresponding to each phase of a manufacturing process according to a fifth embodiment of the present invention;

FIGS. 35A to 35E, 36A to 36E, 37A to 37E, 38A to 38E and 39A to 39E are sectional views corresponding to each phase of a manufacturing process according to a sixth embodiment of the present invention;

DETAILED DESCRIPTION OF THE PREFERRED EMBODIMENTS

The first embodiment applying the present invention to a flash memory will be described with reference to FIGS. 1 to 16.

Figure 1A:
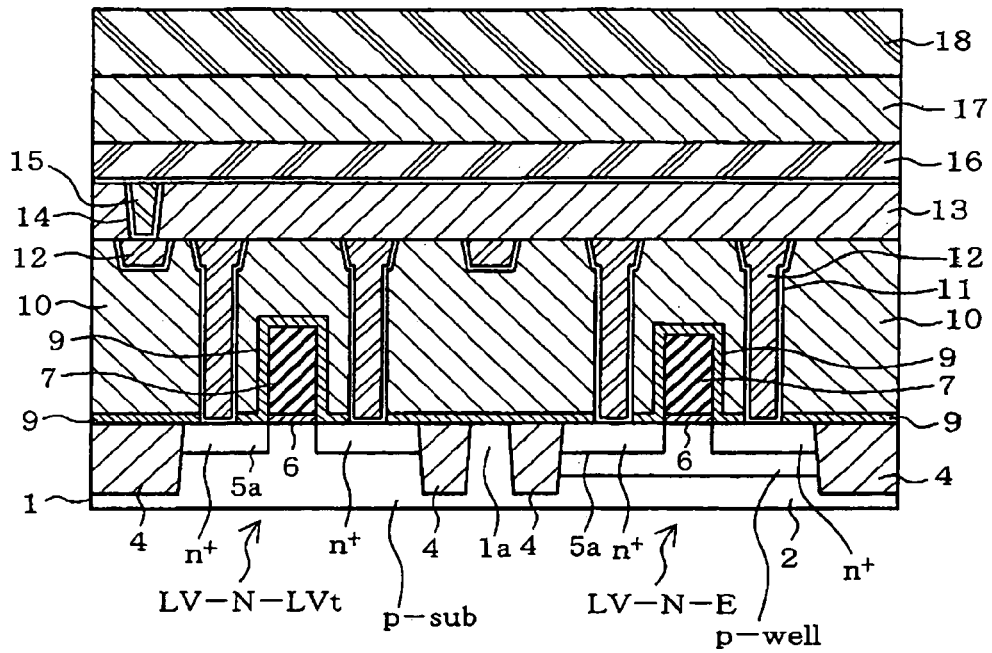
FIGS. 1A and 1B are schematic sectional views indicating a first embodiment of the present invention.
Figure 1B:
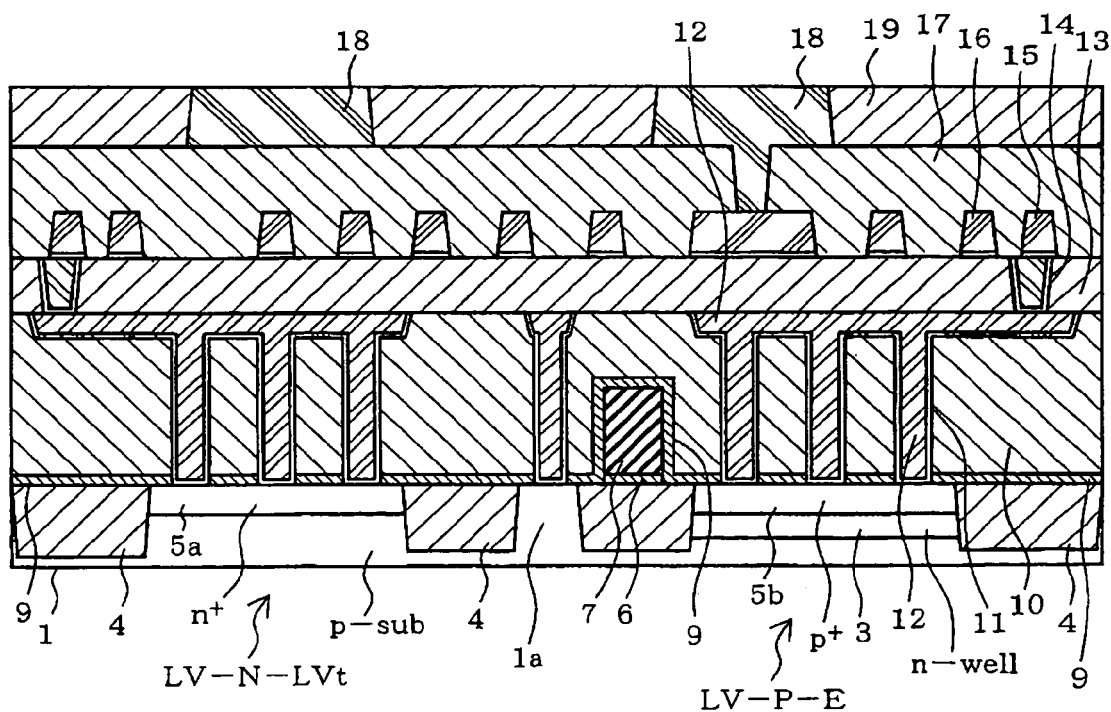
Figure 2:
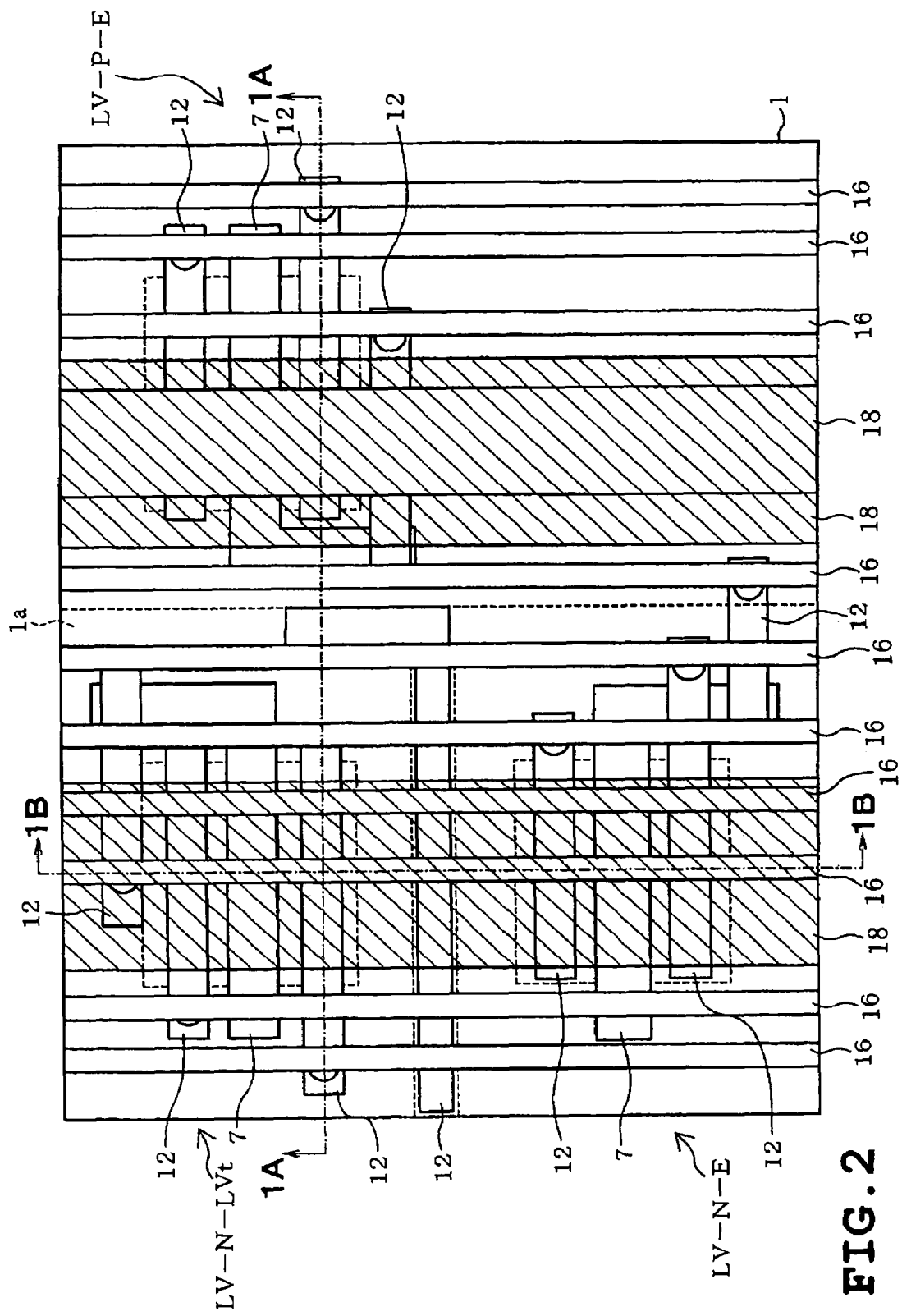
FIG. 2 is a schematic plan view.

FIGS. 1 and 2 illustrate a cross section and a plan view of a transistor formed on a peripheral circuit of the flash memory. The plan view indicated in FIG. 2 exemplifies a part of a p-conduction type (first conductive type) silicon substrate 1 whereby a low-threshold low-voltage N-channel transistor LV-N-LVt, a high-threshold low-voltage P-channel transistor LV-P-E, and high-threshold low-voltage N-channel transistor LV-N-E are illustrated in the upper left, upper right, and lower left of the figure respectively, and a transistor-less state is indicated in the lower right. It is to be noted that the peripheral circuit is actually provided with a low-threshold low-voltage P-channel transistor LV-P-LVt and a high-voltage transistor.

FIGS. 1A and 1B illustrate a vertical section of a portion taken along lines 1A-1A and 1B-1B in FIG. 2. That is, FIG. 1A is a vertical section that transverse the gate electrodes of the low-threshold low-voltage N-channel transistor LV-N-LVt and the high-threshold low-voltage N-channel transistor LV-N-E. FIG. 1B is a vertical section view of an impurity diffusion region taken along the gate electrodes of the low-threshold low-voltage N-channel transistor LV-N-LVt and high-threshold low-voltage P-channel transistor LV-P-E.

In FIGS. 1A and 1B, a P-well 2 (shown as p-well) and an N-well 3 (shown as n-well) are respectively formed on the P-type silicon substrate 1. The P-well 2 serves as the first semiconductor region of the first conductive type for forming the high-threshold low-voltage P-channel transistor LV-N-E. The N-well 3 serves as the second semiconductor region of the second conductive type for forming the low-voltage P-channel transistors LV-P-E and LV-P-LVt. The low-threshold low-voltage N-channel transistor LV-N-LVt is formed directly on the silicon substrate 1 without forming any well.

The regions formed with the P well 2 and the N well 3, and a part of the silicon substrate 1 constitute the element forming region. An STI (Shallow Trench Isolation) 4 is defined in the silicon substrate 1, surrounding the periphery of the element forming region. As will be described later, STI 4 is a shallow trench and is filled with an insulating film such as a silicon oxide film. The region of the silicon substrate 1 where the low-threshold low-voltage N-channel transistor LV-N-LVt is directly formed is surrounded by P well 2.

Impurity diffusion regions 5a and 5b are formed in an element forming region of the silicon substrate 1 surrounded by STI 4. By implanting impurities into the impurity diffusion regions 5a and 5b by way of ion implantation, diffused source/drain are formed respectively. In this case, an N-type impurity diffusion region 5a is formed in the N-channel transistors LV-N-E and LV-N-LVt and a P-type impurity diffusion region 5b is formed on the P-channel transistors LV-P-E and LV-P-LVt. A guard ring 1a which is a region exposing the silicon substrate 1 surface is formed on the outer periphery of the STI 4. As will be described later, impurities are doped into this portion to form a contact, thus rendering a function of a guard ring.

A gate insulating film 6 having small film thickness and a gate electrode 7 are interposed between the source/drain regions of the impurity diffusion regions 5a or 5b of the silicon substrate 1 surfaces of LV-N-E, LV-N-LVt, LV-P-E, and LV-P-LVt forming regions. The gate insulating film 6 is made of silicon insulating film in a thickness of 8 nm for example and for low-voltage use.

Also, the gate electrode 7 is formed by depositing an amorphous silicon film, an ONO (oxide-nitride-oxide) film, a polycrystalline silicon film, and a tungsten silicide film (WSi) This film configuration is identical to the film configuration of the gate electrode of a memory cell transistor not shown. The ONO film constitutes the floating gate for the memory cell transistor. Since each transistor in the peripheral circuit region does not require a floating gate, an opening is partially defined in the deposited ONO film so as to electrically short-circuit the upper layer and the lower layer.

FIG. 1B illustrates the gate electrode 7 of the low-voltage P-channel transistor LV-P-E being formed on the STI 4, exemplifying a case where gate contact is obtained via the STI 4.

A barrier insulating film 9 is formed on the silicon substrate 1 surface inclusive of the gate electrode 7. The barrier insulating film 9 functioning as an etch stopper comprises, for example, a silicon nitride film, the silicon oxinitride film, and an oxide aluminum film. An interlayer insulating film 10 is formed on top of the barrier insulating film 9. The interlayer insulating film 10 comprises, for example, the silicon oxide film, the silicon nitride film, a silicate glass such as BPSG and PSG, and low-k (low-k dielectric) materials such as HSQ, MSQ, and SiLK (registered trademark)

A plurality of contact holes are defined in the interlayer insulating film 10 for contacting the source/drain of each transistor LV-N-E, LV-N-LVt, LV-P-E, and LV-P-LVt. A barrier metal 11 of small film thickness is formed on the inner periphery of the contact holes, and a contact plug 12 is filled inside the contact holes. The barrier metal 11 may comprise Ti, Ta, TaN, TiN, or the like. Also, the contact plug 12 may comprise metal materials such as W (tungsten), Al (aluminum) and Cu (copper).

An interlayer insulating film 13 made of insulating material similar to the above described interlayer insulating film 10 is formed above the interlayer insulating film 10. A first via contact hole is formed on a part of the interlayer insulating film 13 and a first via contact plug 15 is filled therein with a barrier metal 14 interposed therebetween. The first via contact plug 15 is disposed so as to be electrically conductive with the underlying contact plug 12.

A first interconnection layer 16 formed by patterning a metal film such as Al and AlCu is formed on top of the interlayer insulating film 13. The first interconnection layer 16 is formed to serve as the interconnection layer for a bit line, for example. Further, on top of the first interconnection layer 16, an interlayer insulating film 17 is made of a material similar to the aforementioned material. A second via contact hole is defined in the interlayer insulating film 17 and a second interconnection layer 18 also serving as the via contact plug is patterned in the interlayer insulating film 17. The second interconnection layer 18 comprises, for example, tungsten, aluminum, or copper. The second interconnecting layer 18 is buried into an interlayer insulating layer 19.

Next, a manufacturing process of the above described configuration is described with reference to FIGS. 3 to 19

First, as shown in FIGS. 3A to 3D, after cleaning the P-type silicon substrate 1, a sacrificial oxide film 20 is formed to prevent contamination of the substrate and to serve as a backup in case of unsuccessful resist lithography. Subsequently, a lithography process for forming the low-voltage P-channel transistors LV-P-E and LV-P-LVt is performed and the resist 21 in each transistor region is patterned to define an opening therein. Successively, using the aforesaid resist 21 as a mask, P (phosphorous) or As (arsenic) ions are doped in the dose of $1.0\times10^{12}$ to $1.0\times10^{14}$ cm$^{-2}$ into the surface of the silicon substrate 1 to form the N well 3 serving as the second semiconductor region of the second conductive type.

Thereafter, in order to activate the doped impurity ions, annealing process is normally performed in the range of 800° C. to 1200° C. The annealing process may be performed after forming the P-well 2 in addition to the N-well 3 so as to activate the impurity ions altogether. After implanting the impurity ions, the pattern 21 on the resist used as a mask is no longer required, hence is removed by O$_2$ dry asher or chemical treatment.

Next, as shown in FIGS. 4A to 4D, lithography process is performed again to open the resist 22 in the targeted region in order to form the high-threshold low-voltage N-channel transistor LV-N-E. Subsequently, impurities such as B and BF$_2$ are doped into the silicon substrate 1 in a dose on the order of $1.0\times10^{12}$ to $1.0\times10^{14}$ cm$^{-2}$, to form the P well 2 serving as the first semiconductor region of the first conductive type. In addition to impurity ion implantation for P well 2 formation, the first ion implantation process is also performed in which channel impurity ions are doped for defining the threshold voltage of the high-threshold N-channel transistor.

Since LV-N-E is an N-channel type, impurities such as B are doped into the substrate in a dose on the order of $1.0\times10^{12}$ to $1.0\times10^{14}$ cm$^{-2}$. Since P-well 2 is not formed for the transistor forming region of the low-threshold low-voltage N-channel transistor LV-N-LVt, the threshold voltage of the high-threshold low-voltage N-channel transistor LV-N-E alone can be controlled independently. Upon completion of impurity ion implantation process, the resist 22 used as a mask is no longer required, hence is removed by O$_2$ dry asher or chemical treatment.

Next, the sacrificial oxide film 20 having been used up to this point is removed by chemical treatment such as hydrofluroic acid treatment, and the gate insulating film 6 that affects the transistor performance is formed thereafter. In this case, the film thickness of the gate insulating film 6 is 8 nm, for example and the low-voltage transistor region described in this embodiment is often arranged so as to have the similar film thickness as the transistors in the memory array. However, the gate insulating film of the low-voltage transistor region are occasionally arranged to have different film thickness from the memory region transistors in view of improving the transistor performance. Also, a gate insulating film having a large film thickness on the order of 40 nm that corresponds to the high-voltage transistor not shown is formed separately in the gate insulating film forming process.

Next, as shown in FIGS. 5A to 5D, a non-doped amorphous silicon film 23 is deposited in a film thickness on the order of 40 nm by LP-CVD (Low Pressure-Chemical Vapor Deposition) process to form a floating gate electrode configuration on the cell transistors (not shown) in the memory region.

Subsequently, impurities are doped into the N-well 3 of the high-threshold low-voltage P-channel transistor LV-P-E as the second ion implantation process so as to control the threshold voltage of the transistor to a predetermined level. Therefore a resist 24 is patterned by lithography process to define an opening on the N-well 3 surface of the low-voltage P-channel transistor LV-P.

Using the resist 24 as a mask, impurity ions such as B (boron) are doped into the silicon substrate 1 (refer to FIGS. 5A to 5D) in a dose on the order of $1.0\times10^{12}$ to $1.0\times10^{14}$ cm$^{-2}$ through the deposited amorphous silicon film 23. In case impurity ions are doped through the floating gate electrode, the dose of impurity ions doped into the silicon substrate can be increased as compared to doping the same in prior to gate insulating film 6 formation.

If the method is adopted where impurity ions are doped in prior to formation of the gate insulating film 6, because of the thermal processing performed upon gate insulating film 6 formation, the implanted impurity ions become diffused in the silicon substrate 1. Hence, obtaining the desirable threshold voltage becomes difficult since the dose of the impurity ions falls below the effective level. After doping the impurity ions, the resist 24 used as the mask is no longer required, therefore is removed by O$_2$ dry asher or chemical treatment.

Next, as shown in FIGS. 6A to 6D, lithography process is performed to form the low-threshold low-voltage P-channel transistor LV-P-LVt on the N well 3, whereby a resist 25 is patterned and impurity ions such as B are doped into the substrate as the third ion implantation process. At this time, ion implantation is performed in a dose on the order of $1.0\times10^{12}$ to $1.0\times10^{14}$ cm$^{-2}$ through the amorphous silicon film 23 that constitutes the floating gate.

In the third ion implantation process, openings are defined on the resist 25 for the low-threshold low-voltage P-channel transistor LV-P-LVt and the low-threshold low-voltage N-channel transistor LV-N-LVt as well for implanting ions for controlling the threshold voltage regulation.

Next, the silicon nitride film, the silicon oxide film, or the like are deposited on top of the amorphous silicon film 23 formed on the silicon substrate 1. Then, a resist is patterned by lithography process so as to open the STI 4 forming region. Using the resist as a mask, silicon oxide film is etched by RIE process. Further, using the silicon oxide film as a mask, silicon nitride film amorphous silicon film 23, the gate insulating film 6, and the silicon substrate 1 is sequentially etched to form a trench in the silicon substrate 1 having a depth on the order of 0.1 μm to 0.4 μm. Furthermore, the trench is filled with insulating film such as silicon oxide film or silicon nitride film. The STI 4 is formed in this manner. The depth of the element isolation constituted by the STI 4 is arranged to an extent to enable the separation of adjacent P-wells 2 and N-wells 3.

Next, impurity ions such as phosphorous serving as a highly concentrated field-space stopper is implanted through the interlayer insulating film so as to improve a punch through voltage between the low-threshold low-voltage N-channel transistors LV-N-LVt formed on the P-type silicon substrate 1 without well isolation. The low-threshold low-voltage N-channel transistors. LV-N-LVt at issue in the present embodiment formed on the P-type silicon substrate is isolated by being surrounded by the P-well in which case no impurity ion implantation for field through stopper is required.

Thereafter, conductive films such as polycrystalline silicon film heavily doped with impurities such as phosphorous (P) and tungsten silicide (WSi) film is deposited on the order of 500 nm to 1000 nm. Then, the resist is patterned into a form of data transfer line. The gate electrode 7 is formed by being etched anisotropically.

Figure 7A:
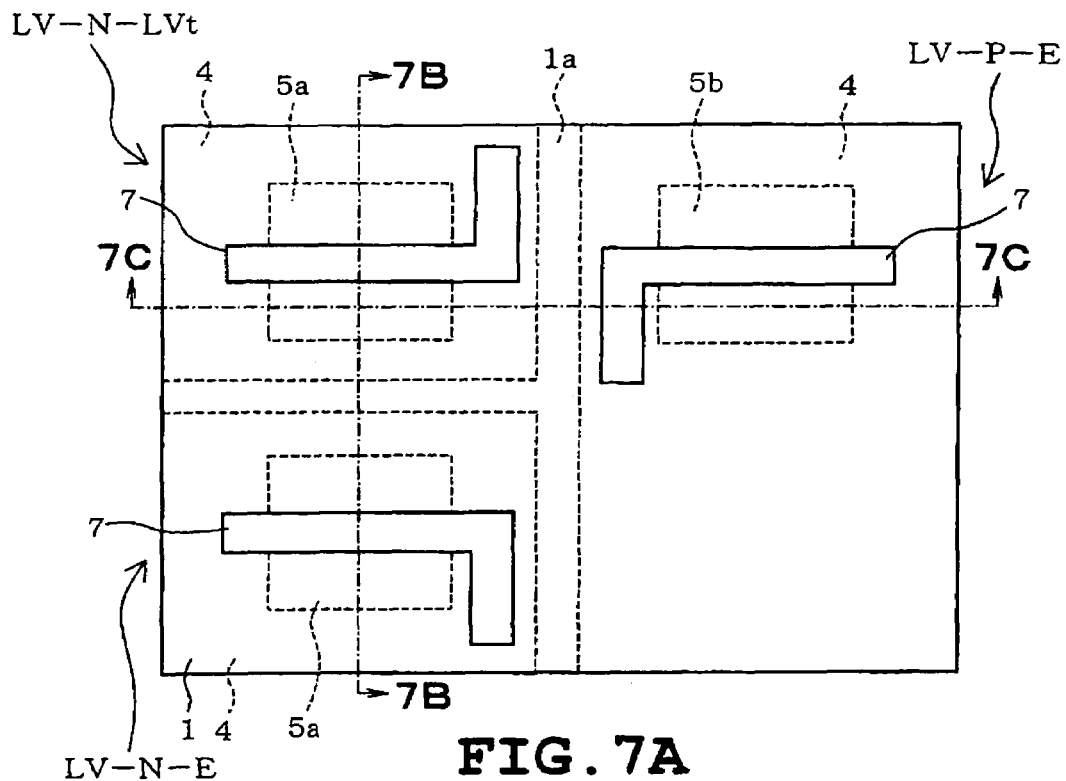
FIGS. 7A to 7C, 8A to BC, 9A to 9C, 10A to 10C, 11A to 11C, 12A to 12C, 13A to 13C, 14A to 14C, 15A to 15C, 16A to 16C, are plan views corresponding to FIG. 2 and sectional views corresponding to FIG. 1 respectively indicating each phase of the manufacturing process.
Figure 7B:
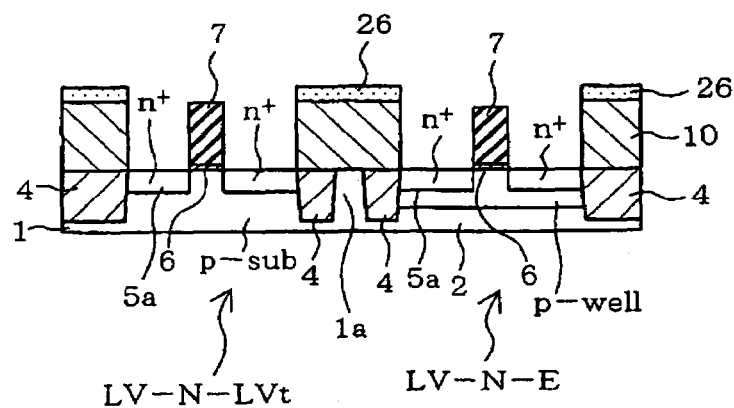
Figure 7C:
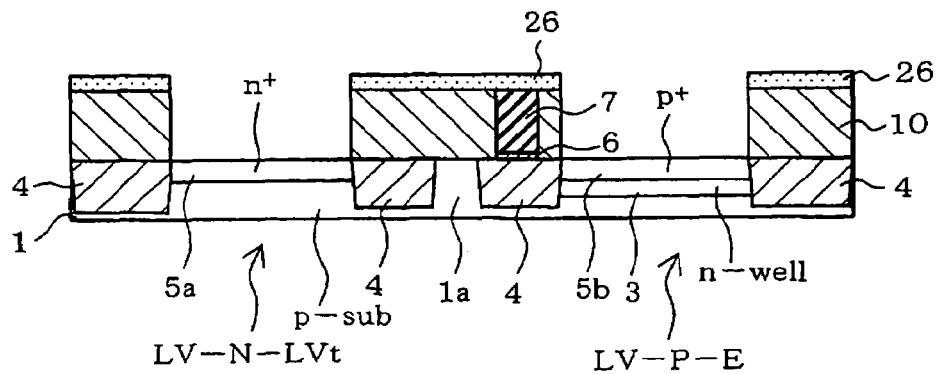

FIGS. 7A to 7C is a plan view and a section view illustrating the transistor formed as described above, where FIG. 7A corresponds to the plan view indicated in FIG. 2 and FIGS. 7B and 7C correspond to a section view indicated in FIGS. 1A and 1B. In the illustrated state, an opening is defined by a resist pattern 26 on the interlayer insulating film 10 formed on the silicon substrate 1 upper surface and impurity diffusion layers 5a and 5b are formed by removing the gate insulating film 6.

Figure 8A:
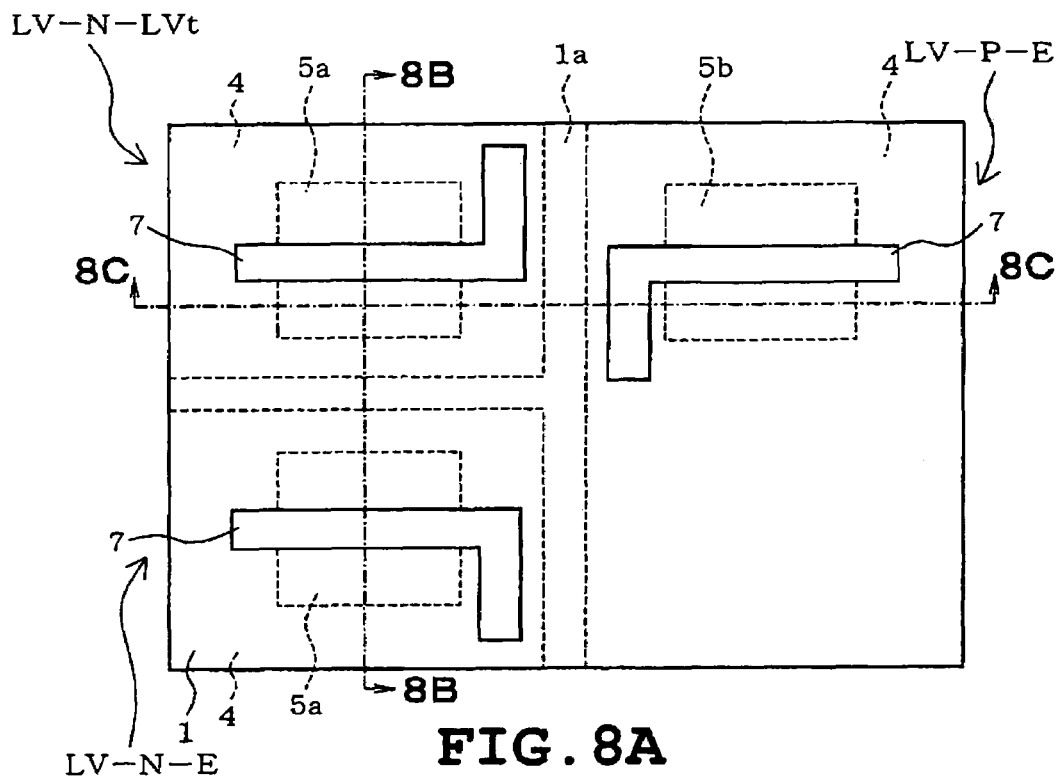
Figure 8B:
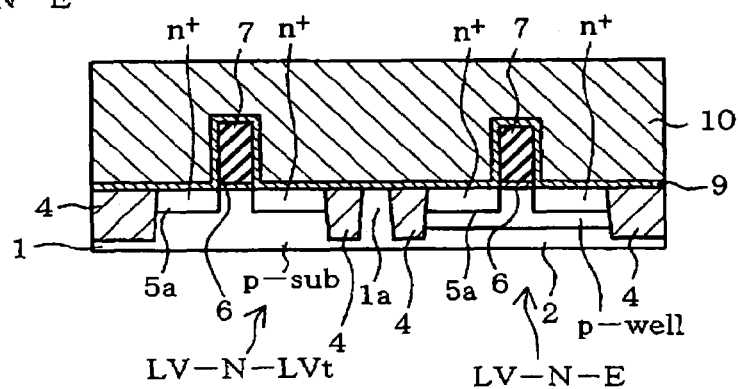
Figure 8C:
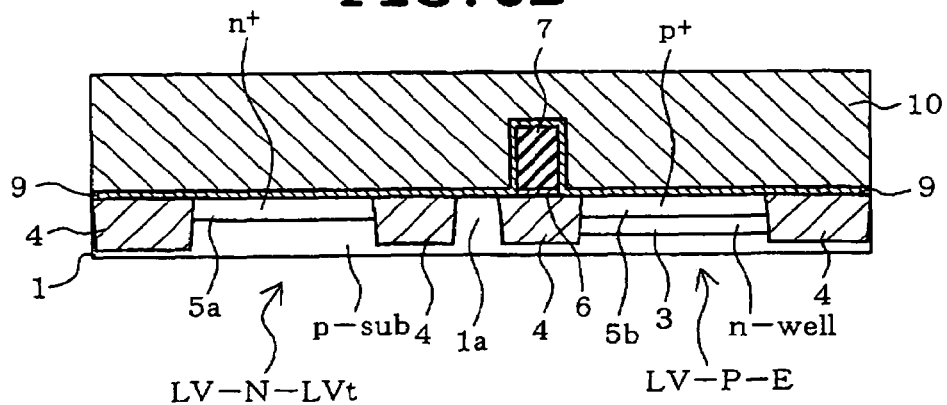

Next, as shown in FIGS. 8A to 8C, the barrier film 9 is deposited in the range of 10 nm to 1000 nm with silicon nitride film or silicon oxynitride film or oxide aluminum film so as to coat the silicon substrate 1 and the gate electrode 7. The barrier insulating film 9 is formed for the following purpose.

That is, in case excessive etching is performed due to poor etching controllability upon defining a contact hole in the interlayer insulating film 10, the contact hole is recessed below the STI 4 (device isolation region) resulting in a failure to ensure the breakdown voltage on the silicon substrate 1 and the contact. On the other hand, insufficient etch at the time of forming the contact results in an undesirable increase in contact resistance between the N-type region and the data transfer line contact.

Thus, when forming the contact, by providing a barrier insulating film 9 in the interlayer insulating film 10 in advance, the interlayer insulating film 10 can be completely etched away by setting a slower etching speed to the barrier insulating film 9 in relative to interlayer insulating film 10. Thereafter, by selectively etching the barrier insulating film 9, the variation of interlayer insulating film 10 thickness upon contact etch can be made less effective.

Also, in prior to depositing the barrier insulating film 9, silicon oxide film ranging from 1 nm to 50 nm may be formed on the silicon substrate 1 surface by oxidization or deposition process. Further, interlayer insulating film 10 comprising silicon oxide film, silicon nitride film, silicate glass such as BPSG and PSG and interlayer films such as HSQ (Hydrogen silsequioxanes), MSQ (methyl silsequioxanes), and SiLK are deposited on the silicon oxide film on the order of 10 nm to 1000 nm.

The interlayer insulating film 10 needs to have a higher selective etching ratio in relative to the material comprising the barrier insulating film 9. The thickness of the barrier insulating film 9 is on the order of 10 nm to 1000 nm, and needs to be provided with sufficient processing margin by the thickness of the interlayer insulating film 10 and the selective etching ratio.

Figure 9A:
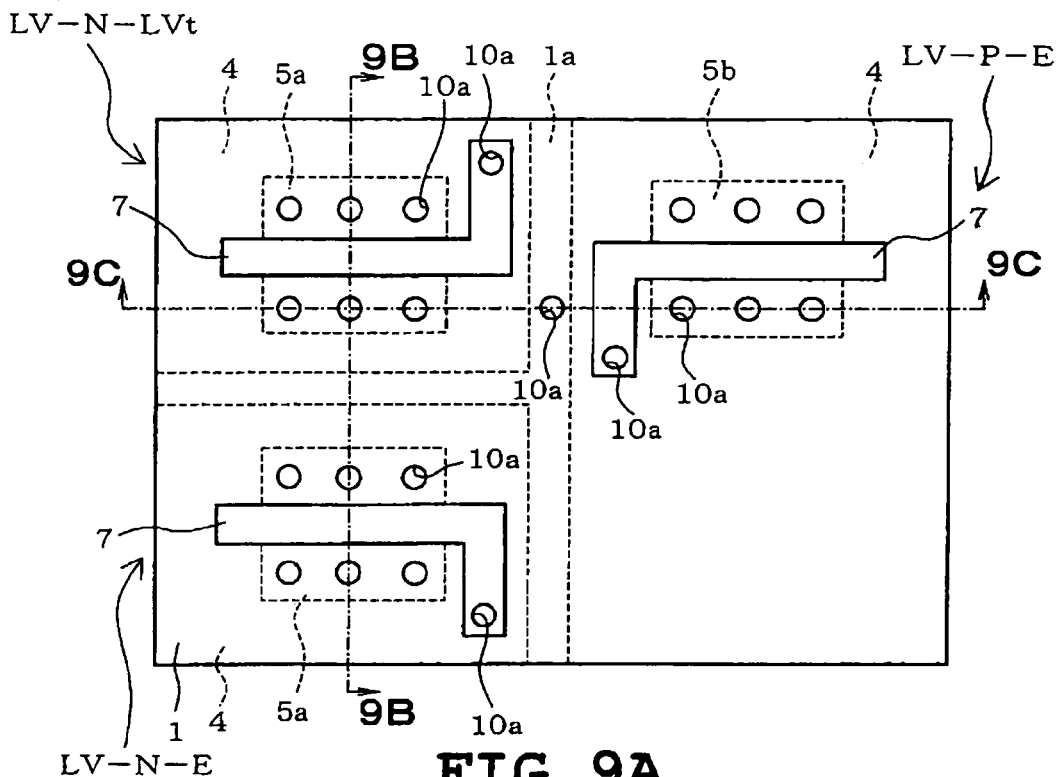
Figure 9B:
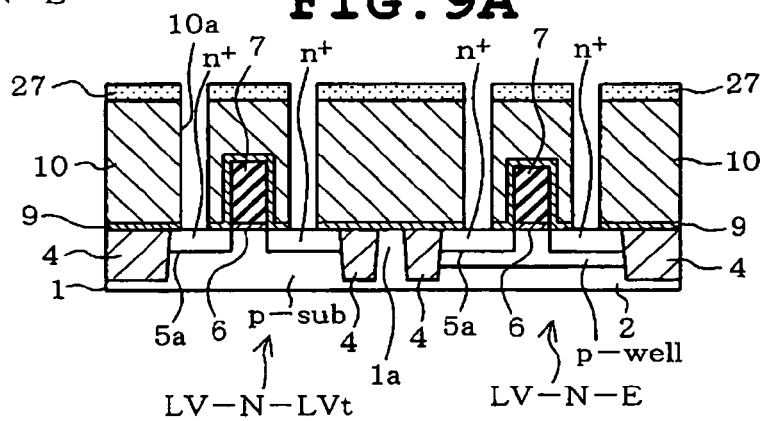
Figure 9C:
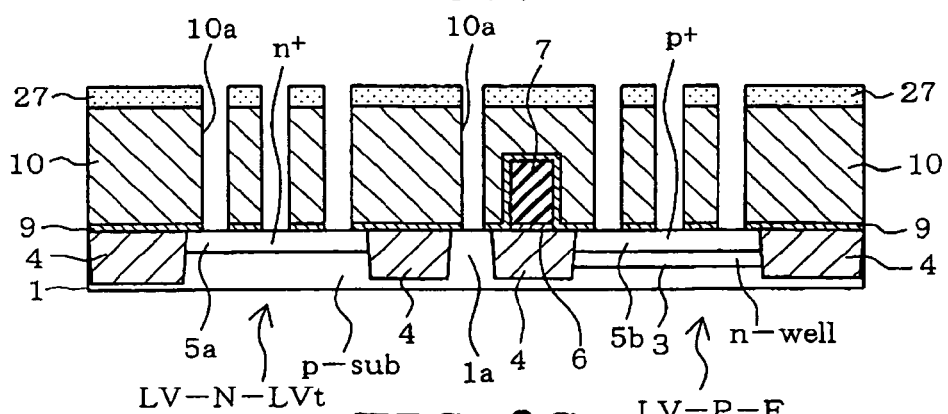

Next, a resist 27 is patterned by lithography process and as shown in FIG. 9A to 9C, an opening 10a is defined for data selection line (gate electrode 7) contact and the substrate source/drain contact. Using the resist 27 as a mask, the interlayer insulating film 10 is patterned by being etched anisotropically at which point a high selective ratio is required in relative to the resist 27 and the barrier insulating film 9.

Figure 10A:
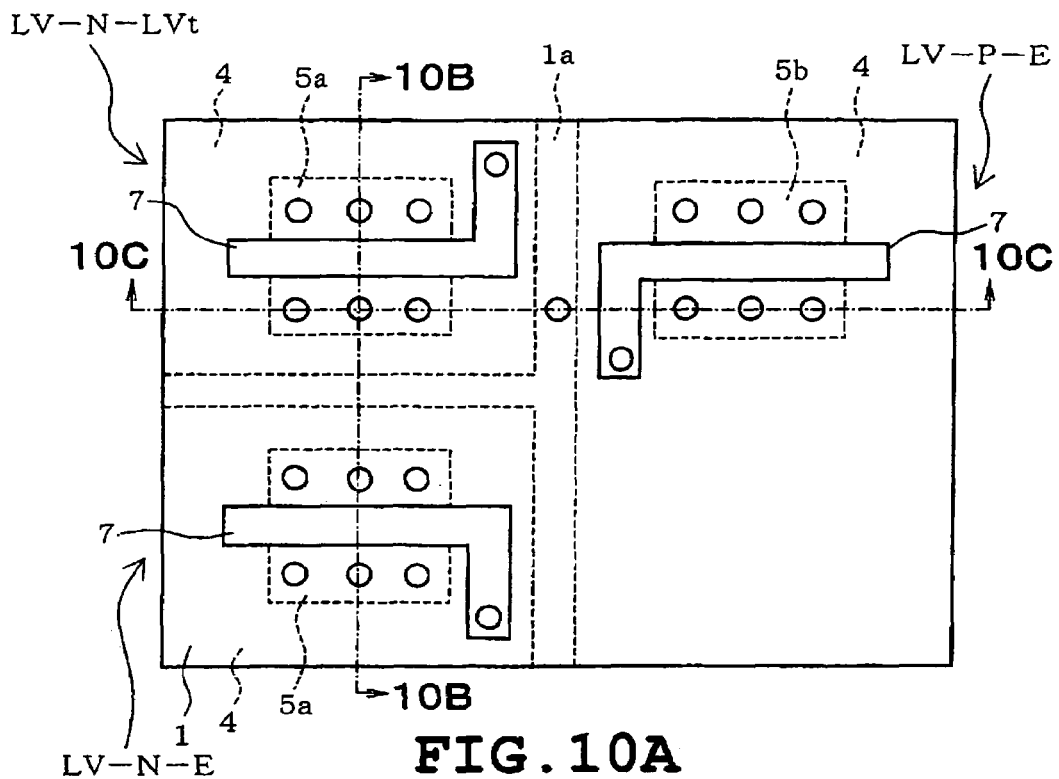
Figure 10B:
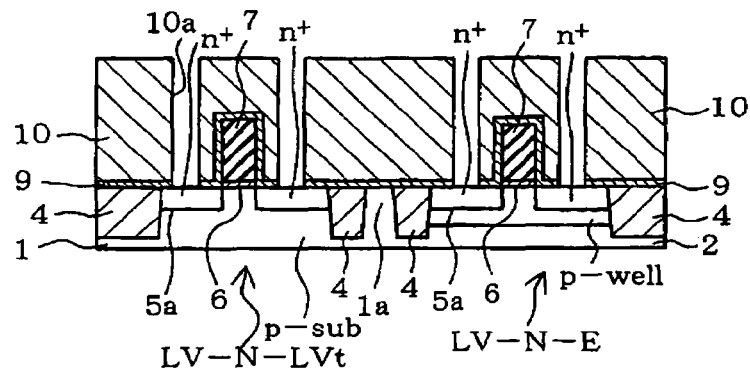
Figure 10C:
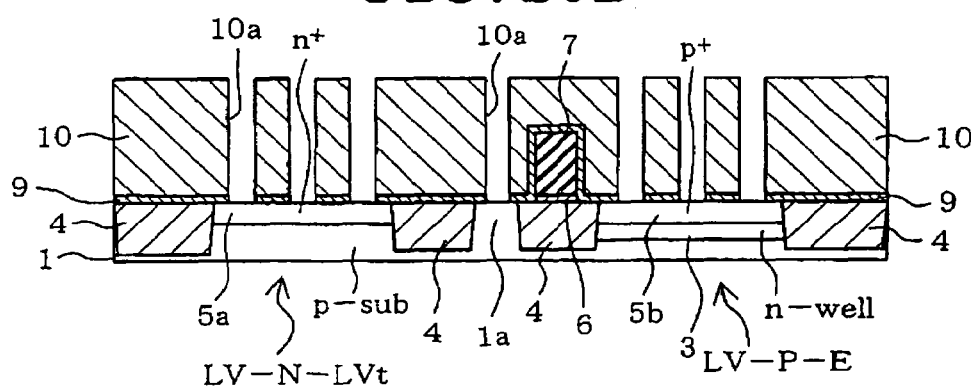
Figure 11A:
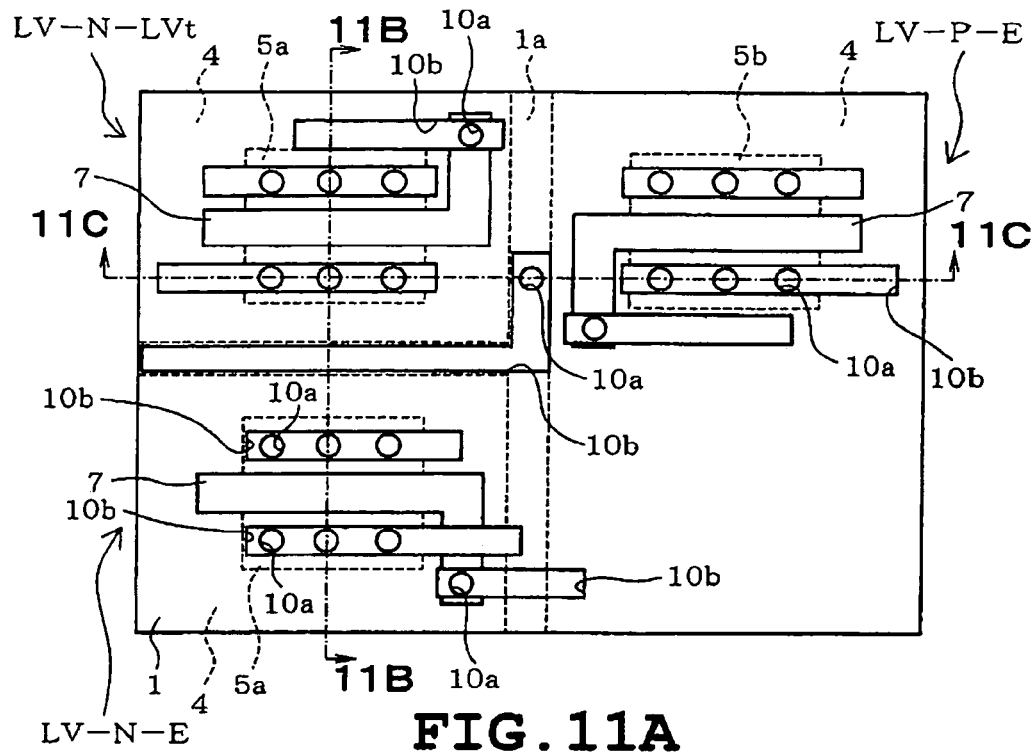
Figure 11B:
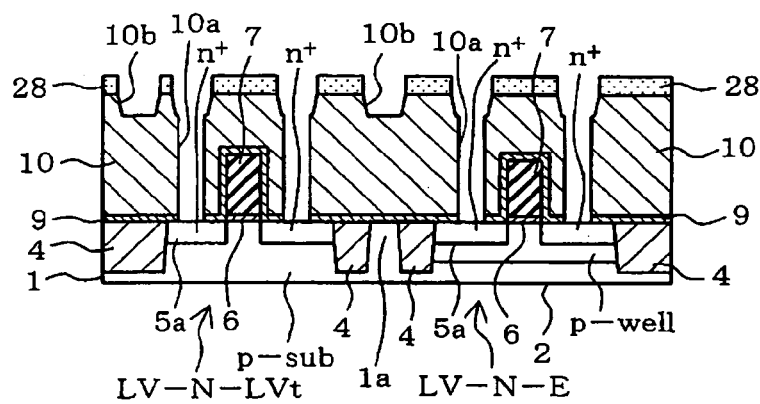
Figure 11C:
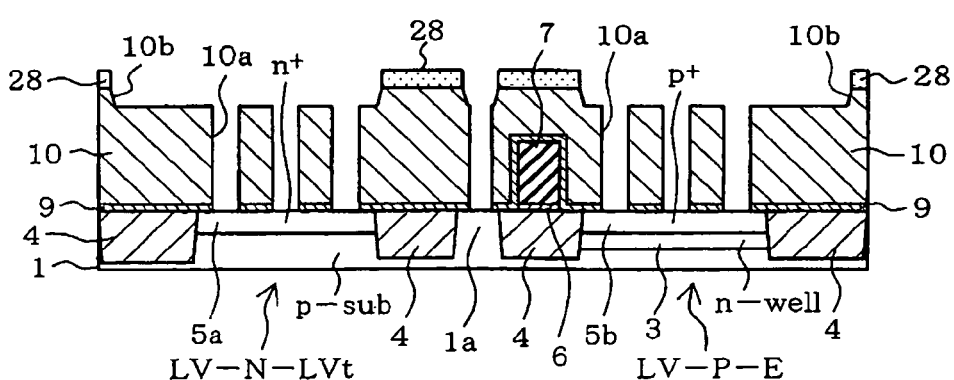
Figure 12A:
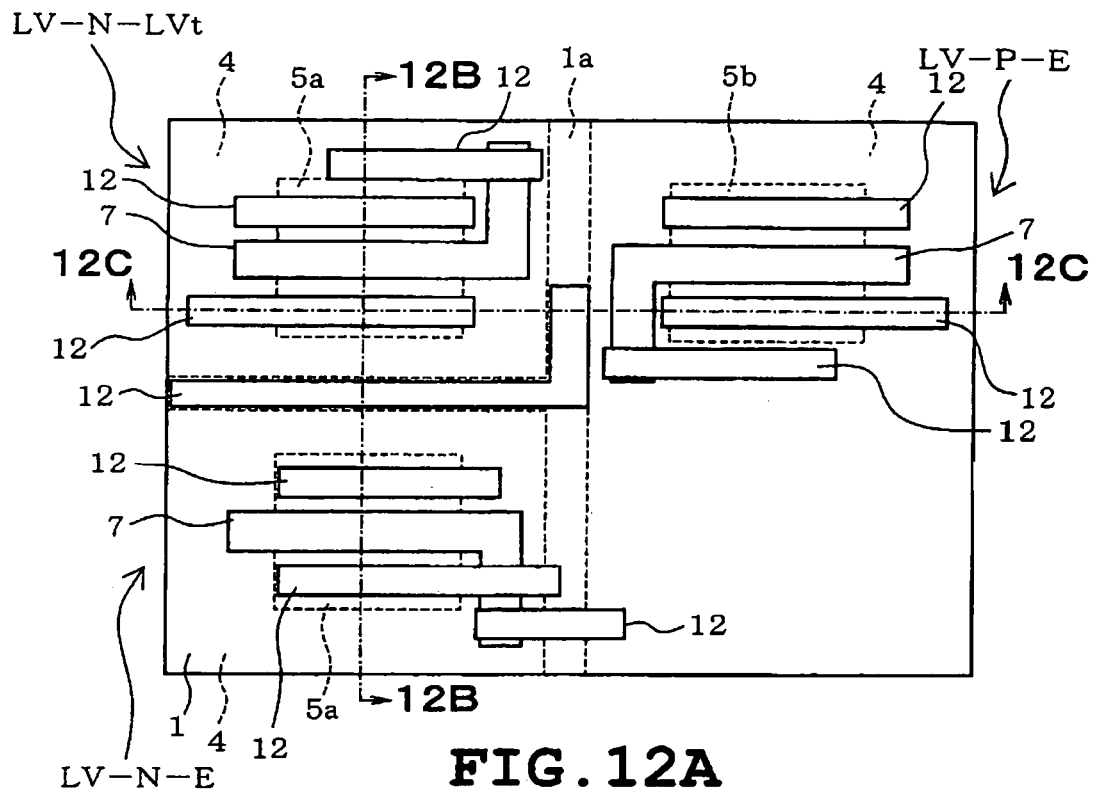
Figure 12B:
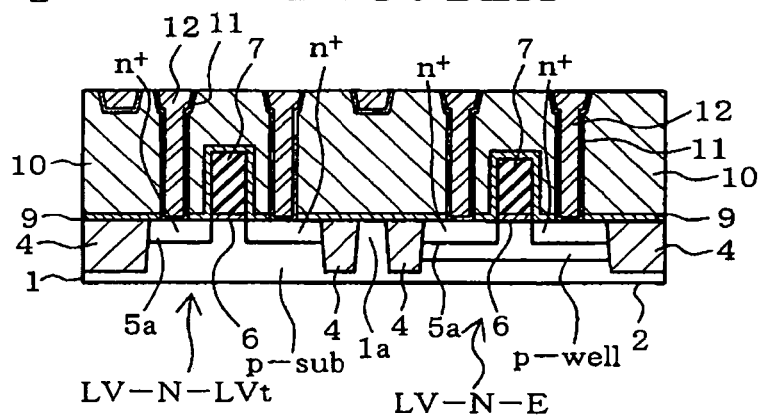
Figure 12C:
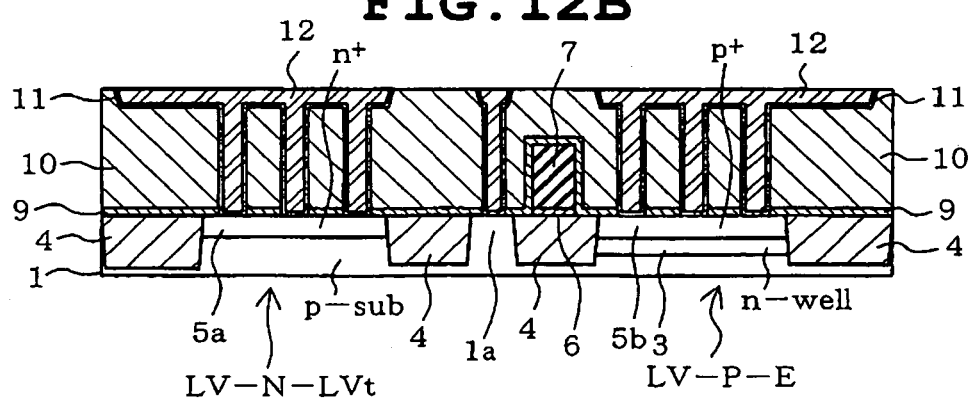

After removing the resist 27, the barrier insulating film 9 exposed in the bottom portion of the contact hole is etched anisotropically as shown in FIGS. 10A to 10C. It is desirable to etch the barrier insulating film 9 under a higher selective ratio in relative to the silicon substrate 1 and the interlayer insulating film 10 so that the backend process can be dispensed with a wet etch process for removing the barrier insulating film 9, and so that a small contact diameter can be maintained by keeping a positive taper without receding the interlayer insulating film 10.

Then, phosphorous or arsenic impurities may be doped by ion implantation in a dose of $1 \times 10^{13}$ cm$^{-2}$ or more to $1 \times 10^{16}$ cm$^{-2}$ or lower in order to reduce the resistivity of the N-type region of the contact hole 10a. On the other hand, B (boron) or BF$_2$ (difluoroboron) impurities may be doped by ion implantation in a dose of $1.0 \times 10^{13}$ cm$^{-2}$ or more to $1.0 \times 10^{16}$ cm$^{-2}$ or lower to similarly reduce the resistivity of the P-type region of the contact hole 10a.

Thereafter, a resist 28 is patterned by lithography process for an outgoing line connected to the contact hole 10a of the source/drain and data selection line, and as shown in FIGS. 10A to 10C, the interlayer insulating film 10 is patterned by anisotropic etch to form an interconnection opening 10b.

Subsequently, the resist 28 is removed and barrier metals 11 such as Ti, Ta, TaN, and TiN are deposited in the contact hole 10a and the interconnection opening 10b in the range of 1 nm to 100 nm by, for example, sputter or CVD process. Then, metal material such as tungsten, aluminum, and copper are deposited in a thickness of 10 nm to 1000 nm and buried into the contact hole 10a and interconnection opening 10b. Thereafter, planarization process is carried out by CMP (Chemical Mechanical Polishing) process, or the like to obtain a resultant configuration illustrated in FIGS. 15A to 15C. CVD process is preferable in this case since the barrier metal 11 can be deposited evenly in contact holes 10a having higher aspect ratios.

Figure 13A:
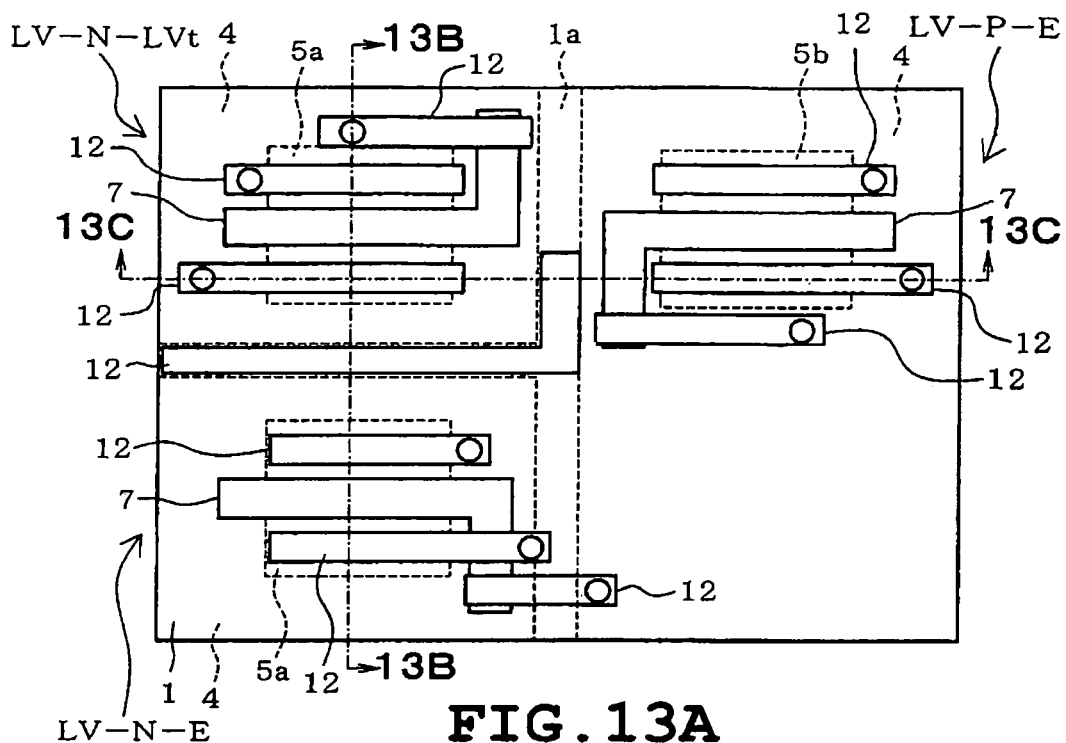
Figure 13B:
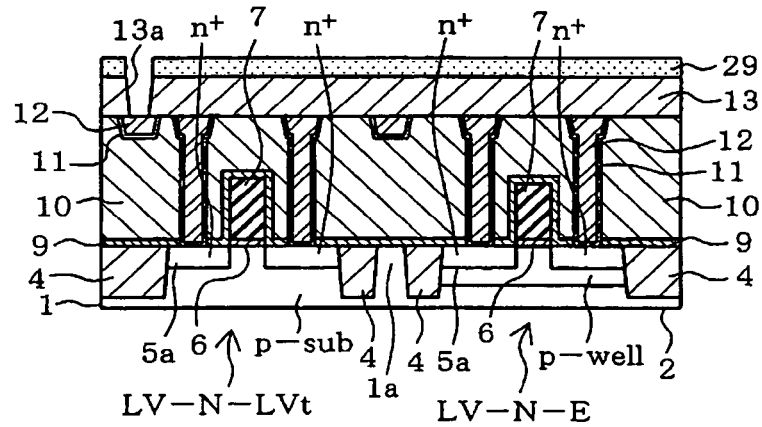
Figure 13C:
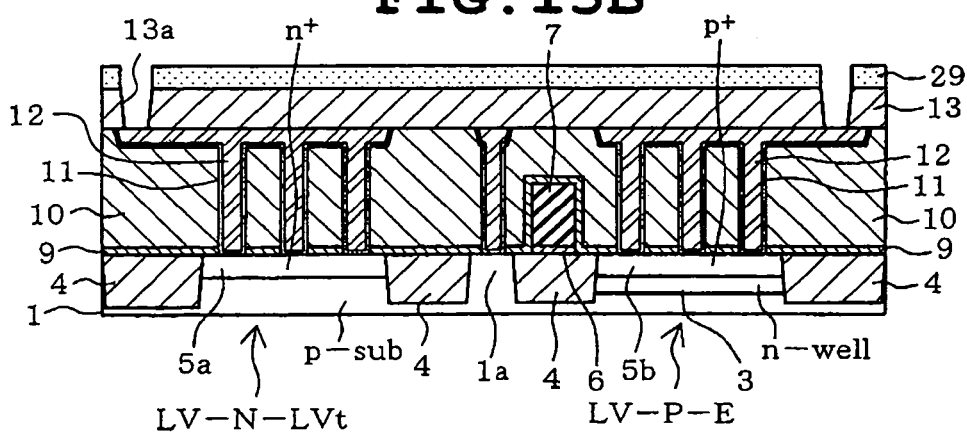
Figure 14A:
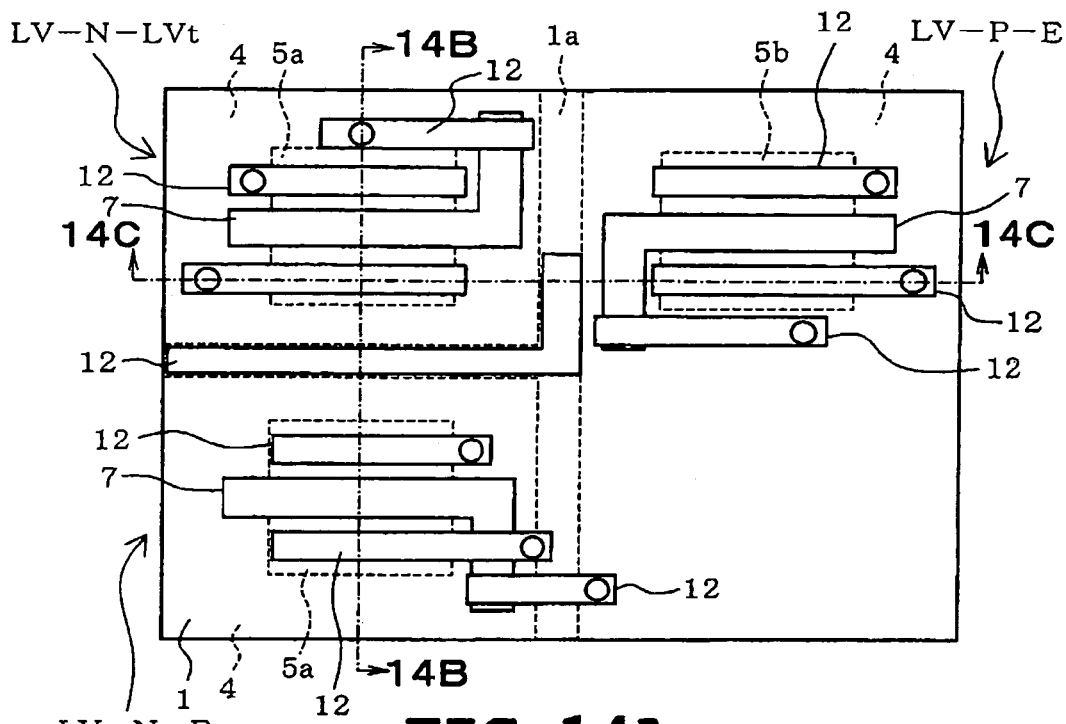
Figure 14B:
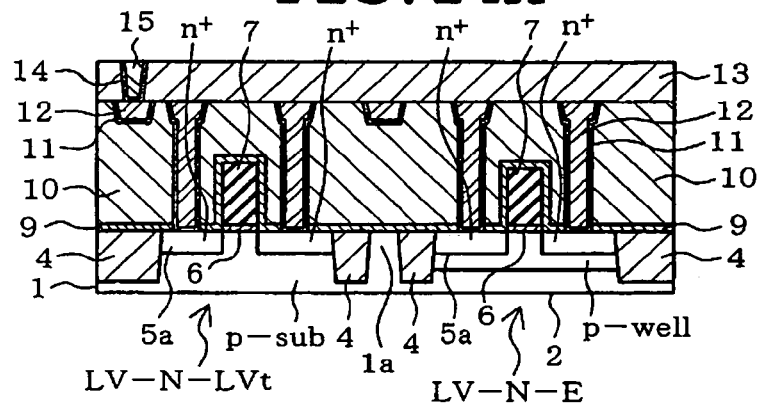
Figure 14C:
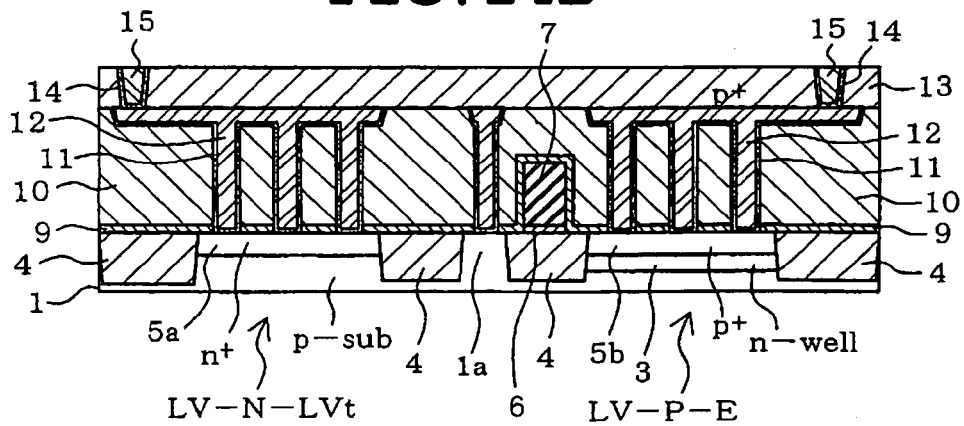

Then, silicon oxide film, silicate glass such as BPSG and PSG, and interlayer insulating film 13 comprising interlayer films such as HSQ, MSQ, and SiLK are deposited on the order of 10 nm to 1000 nm. Next, the first via contact hole 13a is patterned on a resist 30 by lithography process, and as shown in FIGS. 13A to 13C, the first via contact hole 13a is defined by anisotropically etching the interlayer insulating film 13 using the resist 29 as a mask. The interlayer insulating film 13 needs to be performed under a higher selective ratio in relative to metal or barrier metal buried in the resist and lower layer contact.

Subsequently, after removing the resist 29, barrier metal such as Ti, Ta, TaN, and TiN are deposited in the first via contact hole 13a in a thickness of 1 nm to 100 nm by, for example, sputter or CVD process. Then, metal material such as tungsten, aluminum and copper are deposited in a thickness of 10 nm to 1000 nm so as to fill the first via contact hole 13a. Thereafter, planarization is carried out by being etched back by CMP process, or the like to obtain the form illustrated in FIGS. 14A to 14C.

Figure 15A:
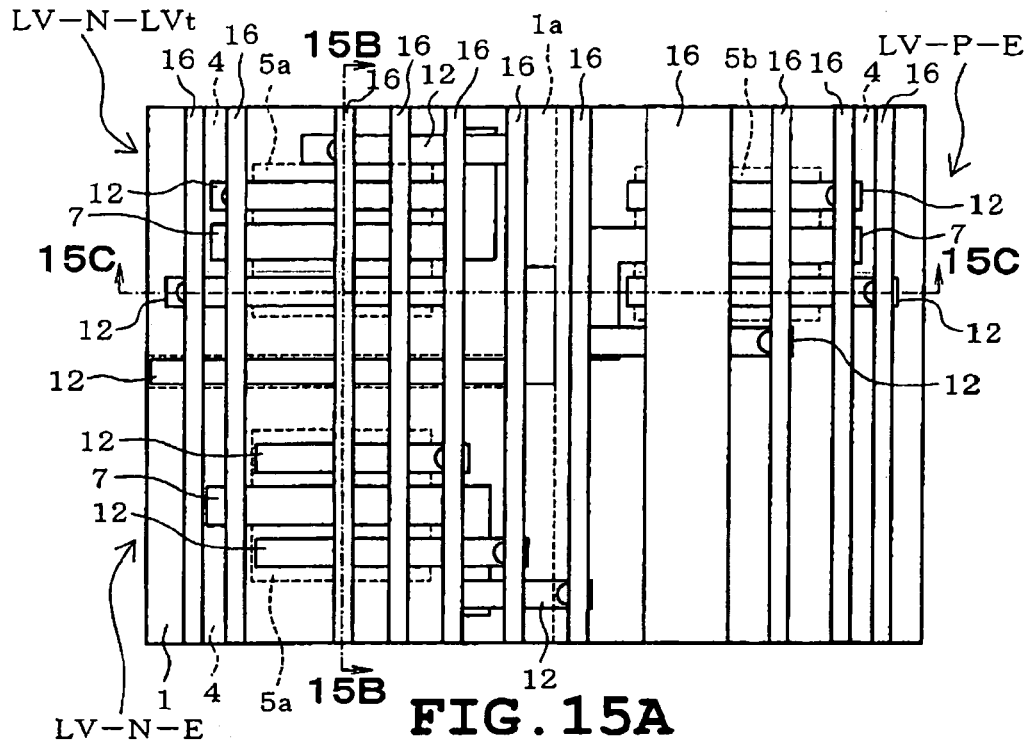
Figure 15B:
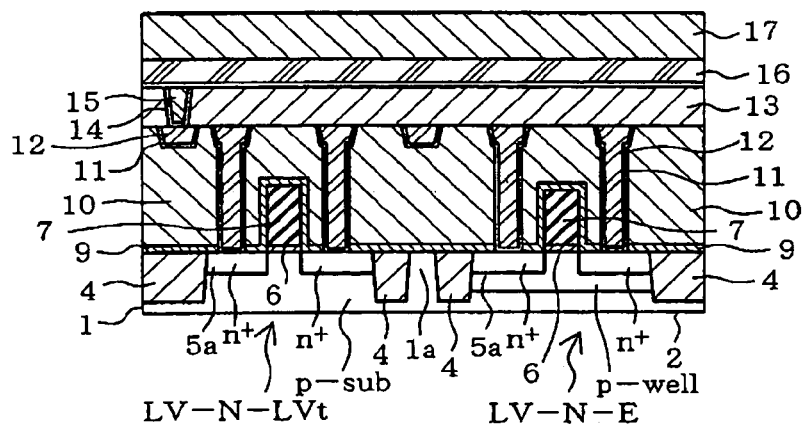
Figure 15C:
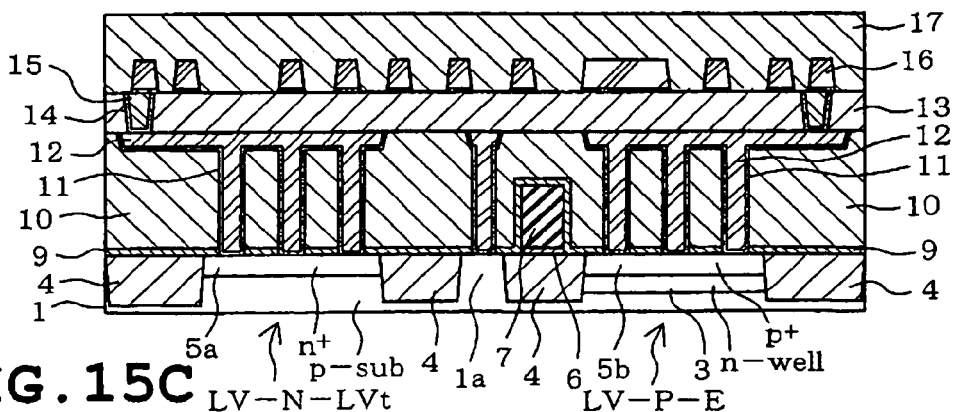

Thereafter, as shown in FIGS. 15A and 15C, Al or AlCu, for example, is deposited on the order of 10 nm to 1000 nm. Further, Al or AlCu is processed into a strip-form oriented in the direction of the sectional line 15B-15B to form an interconnection layer 16 that serves as data transfer line. Then, silicon oxide film, silicon nitride film, silicate glass such as BPSG and PSG and interlayer films such as HSQ, MSQ, and SiLK are deposited on the order of 10 nm to 1000 nm.

Figure 16A:
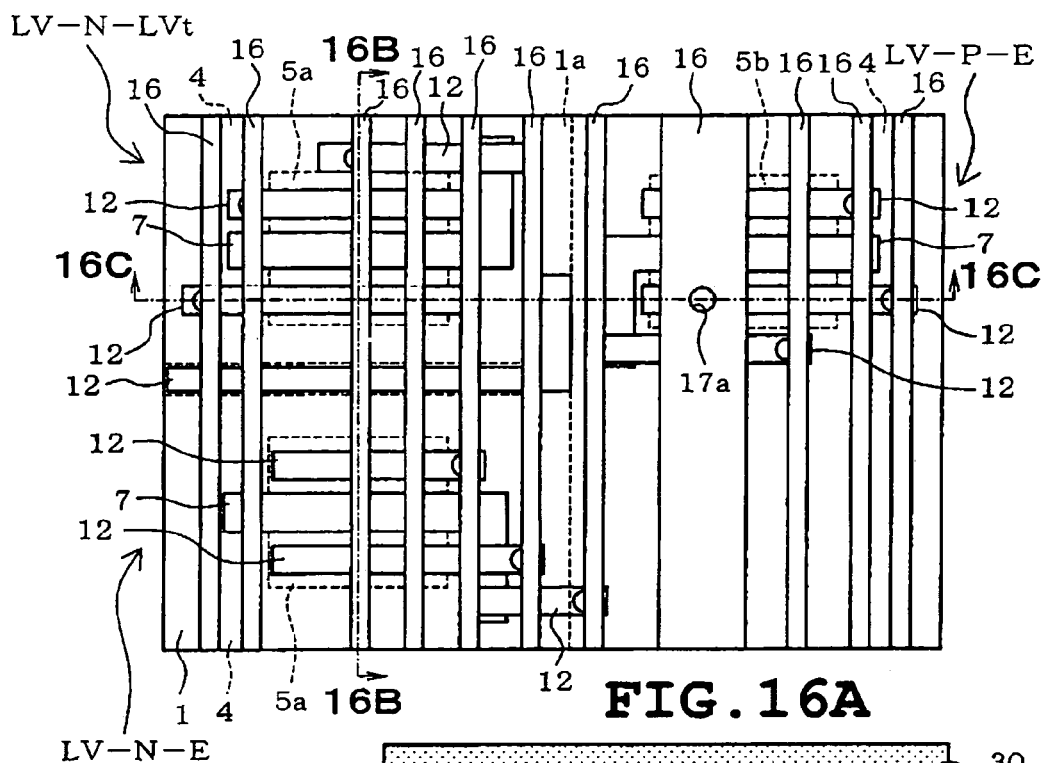
Figure 16B:
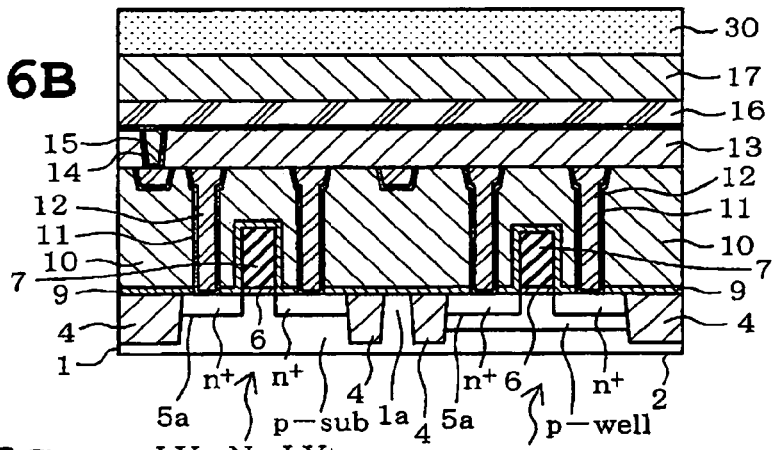
Figure 16C:
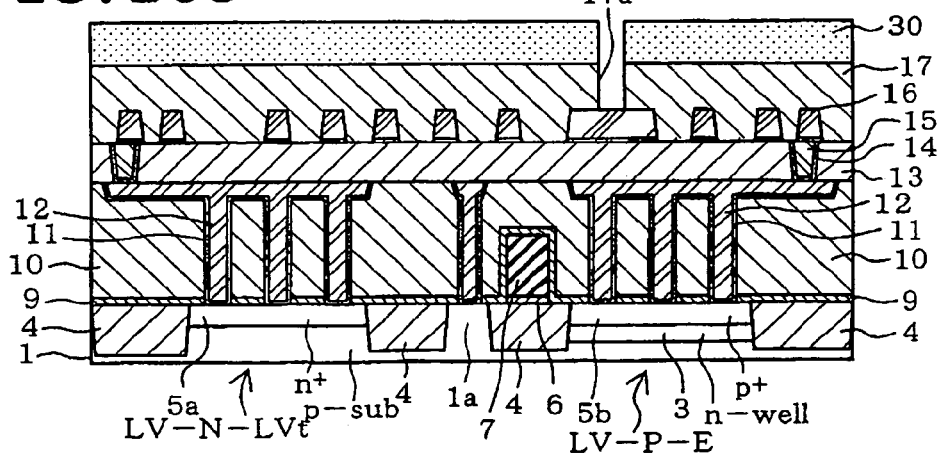
Figures 34A, 34B, 34C, 34D, 34E:
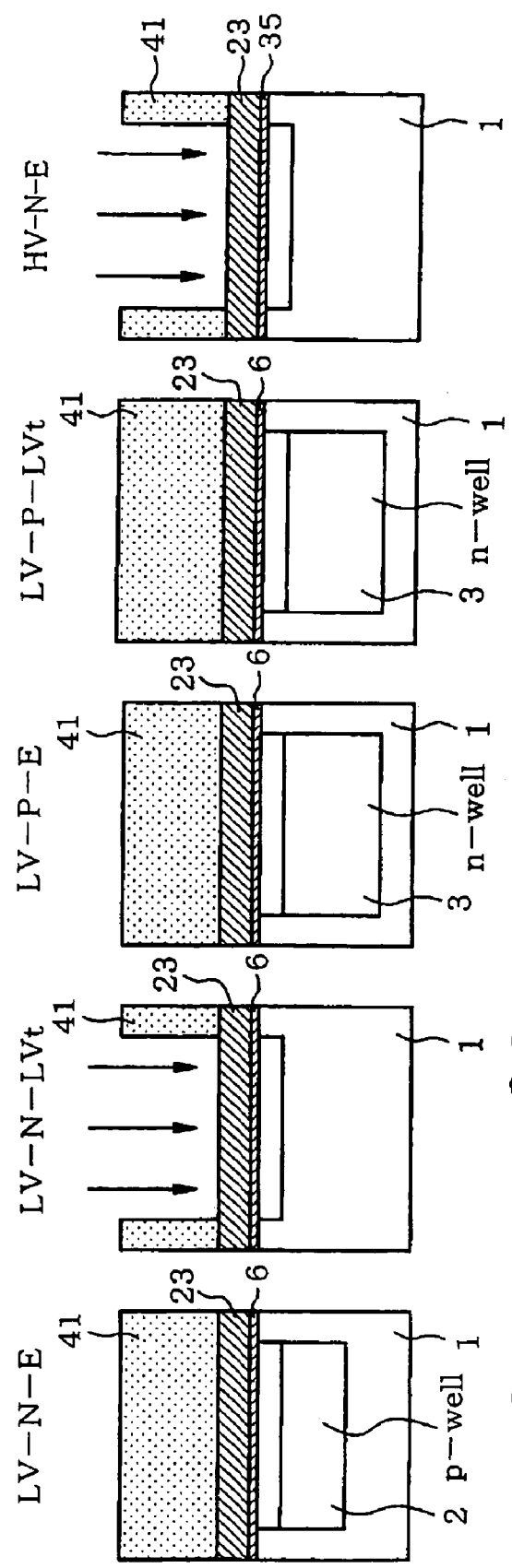
Figures 39A, 39B, 39C, 39D, 39E:
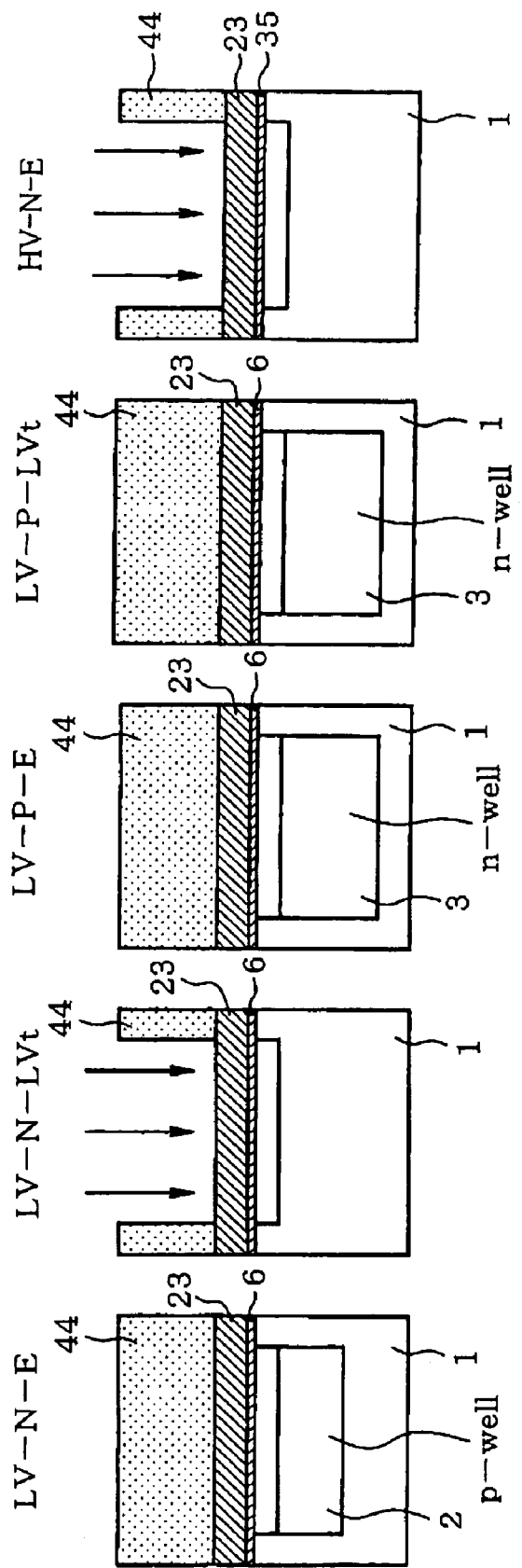

Next, the second via contact hole 17a is patterned by lithography process. Then, as shown in FIGS. 16A to 16C, the interlayer insulating film 17 is patterned by being etched anisotropically. The interlayer insulating film 17 is performed under a higher selective ratio in relative to metal or barrier metal buried in the resist 31 and lower layer contact.

Subsequently, after removing the resist 30, barrier metal such as Ti, Ta, TaN, and TiN are deposited into the second via contact hole 17a by, for example, sputter or CVD process. Then, metal material such as W (tungsten), Al (aluminum) and Cu (copper) are deposited in a thickness of 10 nm to 1000 nm and buried into the second via contact hole 17a, as well as being deposited as a interconnection material of a source line 18.

In this case, the manufacturing method of the first via contact hole 13a and the data transfer line is applicable. That is, barrier metal such as Ti, Ta, TaN, and TiN are deposited in the second via contact hole 17a by, for example, sputter or CVD process in a thickness of 1 nm to 100 nm. Then, metal material such as tungsten, aluminum and copper are deposited in a thickness of 10 nm to 1000 nm. Subsequently, after the second via contact hole is planaraized by CMP fill, Al or AlCu is deposited on the order of 10 to 1000 nm as interconnection material. However, the present embodiment indicates an example of depositing the via contact with electrical conductive material for the source line 18 to enable process simplification.

Lastly, the final form of the present embodiment is obtained by processing the deposited Al, AlCu, or the like on the order of 10 nm to 1000 nm by anisotropic etch performed in lithography process.

Though a detailed description will not be given, exterior stress such as alpha ray, ultra violet ray and air is made less effective by depositing passivation of silicon nitride film or polyamide formed by plasma deposition process on the source line on the order of 0.05 to 2.0 µm for example. The silicon nitride film may be formed by using hexachloro disilane (HCD).

According to the present embodiment, the process cycle can be shortened by forming the low-threshold low-voltage N-channel transistor LV-N-LVt directly on the silicon substrate 1 without well formation and integrating the ion implantation process for threshold voltage regulation. Accordingly, an advantage is provided in that the threshold voltage of the low-threshold low-voltage transistor LV-N-LVt can be controlled independent of the high-threshold low-voltage N-channel transistor LV-N-E.

Also, in the case of adopting the above configuration, since the region of the silicon substrate 1 provided with the low-threshold low-voltage N-channel transistor LV-N-LVt is surrounded by P-well 2, a highly concentrated field stopper need not be provided.

FIGS. 17A to 20D illustrate a second embodiment of the present invention that differ from the first embodiment in the manufacturing process. That is, in the first embodiment, the ion implantation process is executed after the lithography process for forming the high-threshold low-voltage P-channel transistor LV-P-E on the N-well 3 formed in advance. More specifically, impurity ions such as B is doped to the targeted location of the silicon substrate 1 in a dose on the order of $1.0\times10^{12}$ to $1.0\times10^{14}$ cm$^{-2}$ through the amorphous silicon film 23 that constitutes the floating gate electrode. At this time, impurity ions such as B for threshold voltage regulation for forming low-threshold low-voltage N-channel transistor LV-N-LVt is doped simultaneously on the silicon substrate 1 with no P well 2 formed therein.

The present embodiment is no different from the first embodiment in that channel impurity ions are doped simultaneously into the two transistors having different well configurations. The difference is in the concentration of the implanted channel impurity ions. Therefore, the threshold voltage of the low-threshold low-voltage N-channel transistor LV-N-LVt formed on the P-type silicon substrate 1 can be changed from the first embodiment on a required basis, thereby providing improved flexibility in controlling the threshold voltage.

As shown FIGS. 17A to 17D and 18A to 18D, a series of process is performed that is similar to the first embodiment. That is, after the N-well 3 forming process and the first ion implantation process, the resist 31 is patterned by lithography as shown in FIGS. 18A to 18D. The resist 31 is opened with respect to the low-voltage N-channel transistor LV-N-LVt and high-threshold low-voltage P-channel transistor LV-P-E. Subsequenetly, impurities are doped into the opening by ion implantation as the second ion implantation process to control the threshold voltage of each transistor.

After doping impurity ions, the resist used 31 as a mask, which is no longer required, is removed by O$_2$ dry asher or chemical treatment. Then, as shown in FIGS. 20A to 20D, the resist 32 is patterned by lithography process so as to open the portion corresponding to the low-threshold low-voltage P-channel transistor LV-P-LVt. The third ion implantation process is executed thereafter. The transistor forming process following thereafter is the same as aforementioned, hence will not be repeated. Thus, the operation and effect similar to the first embodiment can be obtained likewise in the second embodiment.

FIGS. 21A to 24D illustrate a third embodiment of the present invention differing from the first embodiment in that the ion implantation process performed to control the threshold voltage of the low-threshold low-voltage transistor LV-N-LVt formed on the P-type silicon substrate 1 is executed in both the second and the third ion implantation process.

That is, after performing the process indicated in FIGS. 21A to 21D and FIGS. 22A to 22D, the second and the third ion implantation process are performed by opening the patterns of the resists 33 and 34 for the low-threshold low-voltage N-channel transistor LV-N-LVt as well in the respective ion implantation process as shown in FIGS. 23A to 23D and 24A to 24D.

The operation and effect similar to the first embodiment can be obtained from the above described third embodiment also. Further, the third embodiment is no different from the first and the second embodiment in that, channel impurity ions are doped simultaneously in the two transistors having different well configurations. However, by consecutively implanting the channel impurity ions for controlling the threshold voltages of the high-threshold low-voltage P-channel transistor LV-P-E and the channel impurity ions for the low-threshold P-channel transistor, the resultant channel impurity ion dose can be made different. Thus, the range of threshold voltage controllability of the low-threshold low-voltage N-channel transistor LV-N-LVt formed on the P-type silicon substrate 1 is expanded, thereby improving the freedom of design.

FIGS. 25A to 29E illustrate a fourth embodiment of the present embodiment. The portions that differ from the first embodiment will be described hereinafter. In the present invention, ion implantation for controlling the threshold voltage of the low-threshold low-voltage N-channel transistor LV-N-LVt is executed simultaneously with the high-voltage N-channel transistor HV-N-E formed on the peripheral circuit portion. That is, as shown in FIGS. 25A to 25E, the N-well 3 is formed on the transistor forming regions for low-voltage P-channel transistors LV-P-E and LV-P-LVt. Subsequently, as shown in FIGS. 26A to 26E, the P-well 2 is formed for the high-threshold low-voltage N-channel transistor LV-N-E and ion implantation process (first ion implantation process) is performed thereafter for controlling the threshold voltage.

Then, the sacrificial oxide film 20 is removed and gate insulating films 6 and 35 are formed for the low-voltage transistor and the high-voltage transistor respectively. The film thickness of the gate insulating film 6 is 8 nm for example as aforementioned and the film thickness of the high-voltage transistor is 40 nm for example. The amorphous silicon film 23 is formed thereafter.

Next, as shown in FIGS. 27A to 27E, a resist 36 is patterned in lithography process for forming the high-threshold low-voltage P-channel transistor LV-P-E on the N-well 3 formed in advance. Then, impurity ions such as B are doped into the targeted location of the silicon substrate 1 in a dose on the order of $1.0\times10^{12}$ to $1.0\times10^{14}$ cm$^{-2}$ through the deposited amorphous silicon 23 as the second ion implantation process. At this time, in the second ion implantation process, no impurity ions such as B are doped into the P-type silicon substrate 1 with no P-well 2 formed therein for controlling the threshold voltage of the low-threshold low-voltage N-channel transistor LV-N-LVt.

Next, as shown in FIGS. 28A to 28E, a resist 37 is patterned in lithography process for forming the low-threshold low-voltage N-channel transistor LV-N-LVt on the N-well 3 and impurity ions such as B are doped into the silicon substrate 1 in the targeted location in the dose on the order of $1.0\times10^{12}$ to $1.0\times10^{14}$ cm$^{-2}$ through the deposited amorphous silicon 23 as the third ion implantation process. Here, also, no impurity ions such as B are doped into the P-type silicon substrate 1 with no P-well 2 formed therein for controlling the threshold voltage of the low-threshold low-voltage N-channel transistor LV-N-LVt.

Next, as shown in FIGS. 29A to 29E, a channel impurity implantation process serving as a fourth ion implantation process is performed for defining the threshold voltage of the high-voltage N-channel transistor HV-N-E. Since the high-voltage transistor is a high breakdown voltage type, the film thickness of the gate insulator film 35 is arranged on the order of 40 nm. That is, approximately 5 times thicker than the gate insulating film 6 of the low-voltage transistor. The high breakdown voltage transistor is characterized in normally being formed on the P-type silicon substrate 1 with no wells formed therein so as to improve junction break-down.

The present embodiment is characterized in that impurity ions such as B are doped into the P-type silicon substrate 1 with no P-well 2 formed therein 2 simultaneously for the low-threshold low-voltage N-channel transistor LV-N-LVt and the high-voltage HV-N-E, in order to control the respective threshold voltages. As opposed to the first embodiment in which channel impurity ions are doped simultaneously for the two transistors having different well configurations, the present embodiment is characterized in forming two transistors of different source voltages namely, high breakdown voltage type and low-voltage type on the P-type silicon substrate 1. The threshold voltage of the low-threshold low-voltage N-channel transistor LV-N-LVt can be specified differently from the first embodiment on required basis, thereby improving the flexibility in controlling the threshold voltage.

FIGS. 30A to 34 illustrate a fifth embodiment of the present invention. The present embodiment differs from the fourth embodiment in that impurity ions such as B in a dose on the order of $1.0\times10^{12}$ to $1.0\times10^{14}$ cm$^{-2}$ are doped into the P-type silicon substrate 1 with no P-well 2 formed therein in the second ion implantation process in addition to the fourth ion implantation process in order to control the threshold voltage of the low-threshold low-voltage N-channel transistor LV-N-LVt.

That is, the N-well 3 forming process indicated in FIGS. 30A to 30E and P-well 2 formation and ion implantation process (first ion implantation proces) for controlling the threshold voltage indicated in FIGS. 31A to 31E are executed as in the fourth embodiment. Subsequently, the sacrificial oxide film 20 is removed; the gate insulating films 6 and 35 are formed; and amorphous silicon film 23 is formed thereafter.

Next, as shown in FIGS. 32A to 32E, a resist 39 is patterned in lithography process for forming the high-threshold low-voltage P-channel transistor LV-P-E on the N-well 3 formed in advance and forming the low-threshold low-voltage N-channel transistor LV-N-LVt on the P-type silicon substrate 1. Next, impurity ions such as B are doped into the targeted location of the silicon substrate 1 in the dose on the order of $1.0\times10^{12}$ to $1.0\times10^{14}$ cm$^{-2}$ through the deposited amorphous silicon 23 as the second ion implantation process.

Successively, as shown in FIGS. 33A to 33E, a resist 40 is patterned in lithography process for forming the low-threshold low-voltage N-channel transistor LV-N-LVt on the silicon substrate 1. Impurity ions such as B are thereafter doped into the silicon substrate 1 in the dose on the order of $1.0\times10^{12}$ to $1.0\times10^{14}$ cm$^{-2}$ through the deposited amorphous silicon 23 as the third ion implantation process.

Next, as shown in FIGS. 34A to 34E, a resist 41 is patterned in lithography process for forming the low-threshold low-voltage N-channel transistor LV-N-LVt on the P-type silicon substrate 1.

Thus, in the above described fifth embodiment also, the threshold voltage of the low-threshold low-voltage N-channel transistor LV-N-LVt formed on the P-type silicon substrate 1 can be specified differently from the first embodiment on required basis, thereby improving the flexibility in controlling the threshold voltage.

FIGS. 35A to 39E illustrate a sixth embodiment of the present invention. The present embodiment differs from the fourth embodiment in that, impurity ions such as B are doped into the targeted location of the P-type silicon substrate 1 with no P-well 2 formed therein for controlling the threshold voltage of the low-threshold low-voltage N-channel transistor LV-N-LVt in the dose on the order of $1.0\times10^{12}$ to $1.0\times10^{14}$ cm$^{-2}$ through the deposited amorphous silicon 23 in the third ion implantation process as well as the fourth ion implantation process.

That is, as in the fourth embodiment, process illustrated in FIGS. 35A to 37, and 36A to 36E are carried out, followed by the formation of the gate insulating films 6 and 35 and then the amorphous silicon film 23. Subsequently as illustrated in FIG. 37A to 37E, a resist 42 is patterned in lithography process for controlling the threshold voltage for the high-threshold low-voltage P-channel transistor LV-P-E and the low-threshold low-voltage N-channel transistor LV-N-LVt respectively. Then, impurity ions such as B are doped into the silicon substrate 1 in a dose on the order of $1.0\times10^{12}$ to $1.0\times10^{14}$ cm$^{-2}$ through the deposited amorphous silicon 23 as the second ion implantation process.

Next, as shown in FIGS. 38A to 38E, a resist 43 is patterned in lithography process for forming the low-threshold low-voltage P-channel transistor LV-P-LVt on the N-well 3. Then, impurity ions such as B are doped into the silicon substrate 1 in the targeted location in the dose on the order of $1.0\times10^{12}$ to $1.0\times10^{14}$ cm$^{-2}$ through the deposited amorphous silicon 23 as the third ion implantation process.

Subsequently, as shown in FIGS. 39A to 39E, a resist 44 is patterned in lithography process for controlling the threshold voltages of the high-voltage N-channel transistor HV-N-E and low-threshold low-voltage N-channel transistor LV-N-LVt formed on the P-type silicon substrate 1.

Thus, in the above described sixth embodiment also, the threshold voltage of the low-threshold low-voltage N-channel transistor LV-N-LVt formed on the P-type silicon substrate 1 can be specified differently from the first embodiment on required basis, thereby improving the flexibility in controlling the threshold voltage.

Figure 40:
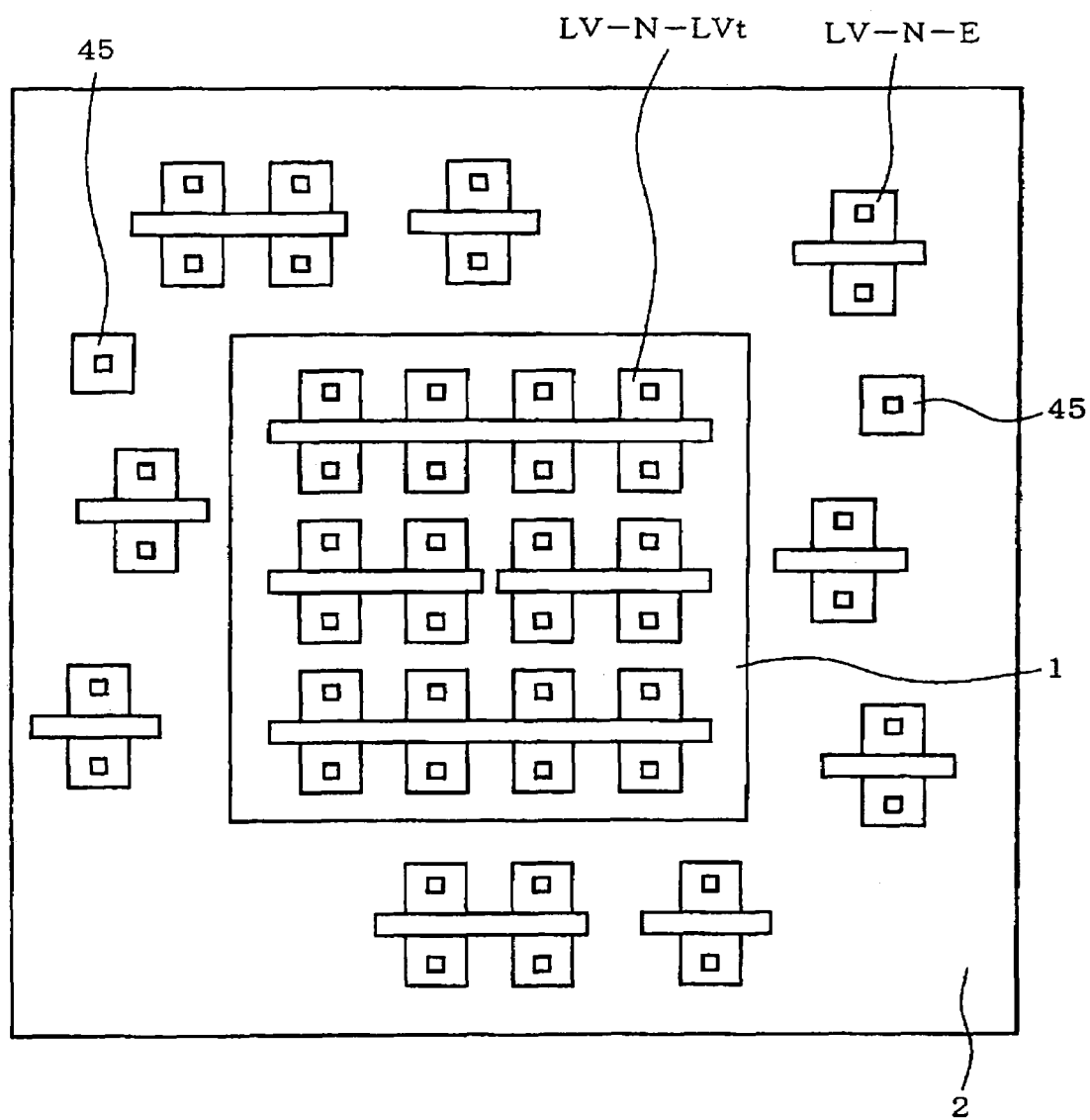
FIG. 40 is a schematic plan view according to a seventh embodiment of the present invention.

FIG. 40 illustrates a seventh embodiment of the present invention. The present embodiment differs from the first embodiment in that the low-threshold low-voltage N-channel transistor LV-N-LVt, formed on the P-type silicon substrate 1 in the first to the sixth embodiment, has the transistor forming region thereof surrounded by P-well 2.

As shown in FIG. 40, there is no limitation on the number of low-threshold low-voltage N-channel transistors formed on the P-type silicon substrate 1. Also, a guard ring 45 for obtaining contact with the P-well 2 and the high-threshold low-voltage N-channel transistor LV-N-E is disposed on the surrounding P-well 2.

By adopting the above described configuration, the surrounding P-well 2 functions as a field-stopper for the low-threshold low-voltage N-channel transistor LV-N-LVt.

Figure 41B:
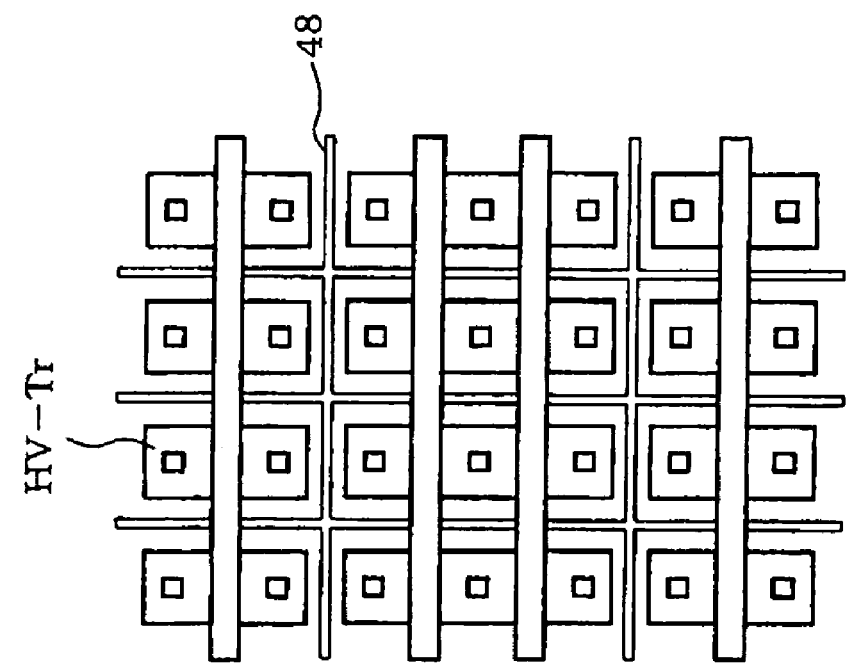
FIG. 41 is a schematic plan view according to an eighth embodiment of the present invention.
Figure 41A:
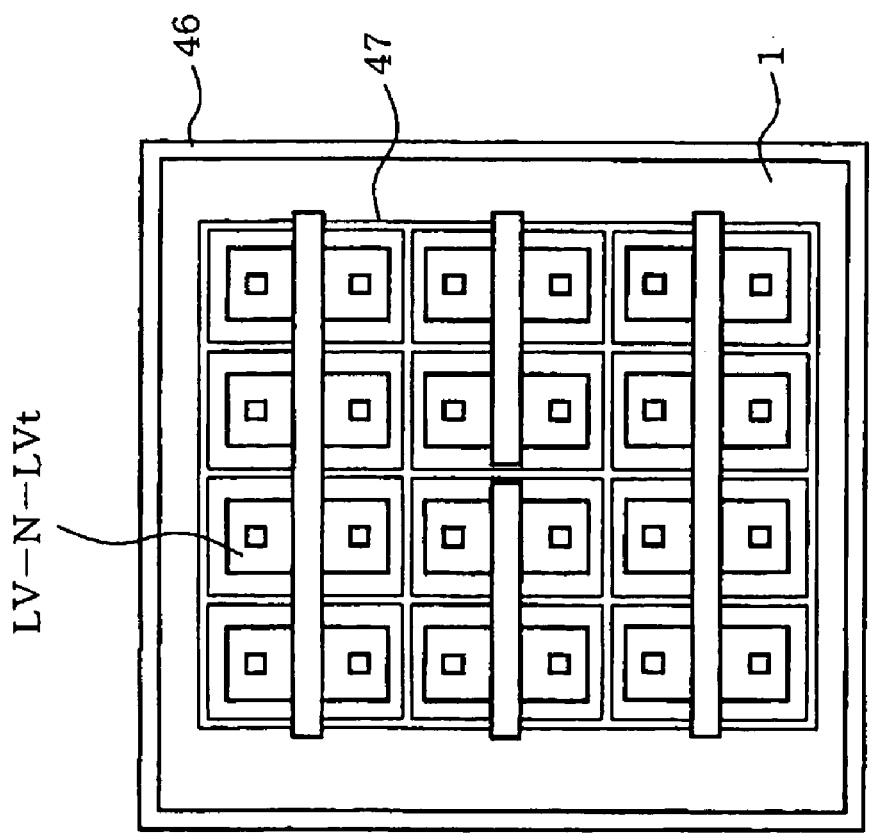

FIG. 41 illustrates an eighth embodiment of the present invention. The present embodiment differs from the first embodiment in that the low-threshold low-voltage N-channel transistors formed on the P-type silicon substrate 1 is not surrounded by P-well 2 but is isolated by a field stopper 46. In case P-well 2 cannot be disposed for surrounding the low-threshold low-voltage N-channel transistors LV-N-LVt overlaying the P-type silicon substrate 1 due to lay-out difficulties, a field stopper 47 can be formed by implanting highly-doped impurity ions such as B through an insulating oxide film in the element isolation region after forming the element isolation region for each transistor.

The low-threshold low-voltage N-channel transistor LV-N-LVt on the P-type silicon substrate 1 operates under low-voltage hence does not require high breakdown voltage. Each transistor need not but can be isolated from each other by the field stopper 47 for reassurance.

Also, since the forming region of the low-threshold low-voltage N-channel transistor LV-N-LVt is isolated by the field stopper 46, P-well 2 need not be disposed to enclose the LV-N-LVt and various types of high breakdown voltage transistors HV-Tr can be alternatively disposed around the LV-N-LVt. Providing such flexibility in the layout is the advantage of the present embodiment. Since the high breakdown voltage transistors HV-Tr is often formed on the P-type silicon substrate 1, each transistor need to be isolated by the field stopper 48 in such case.

The foregoing description and drawings are merely illustrative of the principles of the present invention and are not to be construed in a limited sense. Various changes and modifications will become apparent to those of ordinary skill in the art. All such changes and modifications are seen to fall within the scope of the invention as defined by the appended claims.

What is claimed is:

1. A method of manufacturing a semiconductor device comprising:
    forming a first semiconductor region of a first conductive type and a second semiconductor region of a second conductive type in a predetermined region of a semiconductor substrate of the first conductive type;
    controlling threshold voltages corresponding to each transistor formed on the semiconductor substrate, the first semiconductor region and the second semiconductor region respectively by first to third ion implantation processes executed sequentially;
    wherein the first ion implantation process is executed in a high-threshold low-voltage transistor forming region of the first semiconductor region after the forming the first semiconductor region; the second ion implantation process is executed in a high-threshold low-voltage transistor forming region of the second semiconductor region; and the third ion implantation is executed simultaneously in low-threshold low-voltage transistor forming regions of the semiconductor substrate and the second semiconductor region respectively.

2. A method of manufacturing a semiconductor device comprising:
    forming a first semiconductor region of a first conductive type and a second semiconductor region of a second conductive type in a predetermined region of a semiconductor substrate of the first conductive type;
    controlling threshold voltages corresponding to each transistor formed on the semiconductor substrate, the first semiconductor region and the second semiconductor region respectively by first to third ion implantation processes executed sequentially,
    wherein the first ion implantation process is executed in a high-threshold low-voltage transistor forming region of the first semiconductor region after the forming the first semiconductor region; the second ion implantation process is executed simultaneously in a low-threshold low-voltage transistor forming region of the semiconductor substrate and the high-threshold low-voltage transistor forming region of the second semiconductor region; and the third ion implantation process is executed in the low-threshold low-voltage transistor forming region of the second semiconductor region.

3. The method of according to claim 2, wherein the third ion implantation process is also executed in the low-threshold low-voltage transistor forming region of the semiconductor substrate.

4. A method of manufacturing a semiconductor device comprising:
    forming a first semiconductor region of a first conductive type and a second semiconductor region of a second conductive type in a predetermined region of a semiconductor substrate of the first conductive type;
    controlling threshold voltages corresponding to each transistor formed on the semiconductor substrate, the first semiconductor region and the second semiconductor region respectively by first to fourth ion implantation processes executed sequentially;
    wherein the first ion implantation process is executed in a high-threshold low-voltage transistor forming region of the first semiconductor region after the forming the first semiconductor region; the second ion implantation process is executed in a high-threshold low-voltage transistor forming region of the second semiconductor region; the third ion implantation process is executed in the low-threshold low-voltage transistor forming region of the second semiconductor region; and the fourth ion implantation is executed simultaneously on the low-threshold low-voltage transistor forming region and the high-voltage transistor forming region of the semiconductor substrate respectively.

5. The method according to claim 4, wherein the second ion implantation process is also executed in the low-threshold low-voltage transistor forming region of the semiconductor substrate.

6. The method according to claim 4, wherein the third ion implantation process is also executed in the low-threshold low-voltage transistor forming region of the semiconductor substrate.

* * * * *